(12) United States Patent
Yamazaki

(10) Patent No.: US 9,324,875 B2
(45) Date of Patent: Apr. 26, 2016

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/054,180

(22) Filed: Oct. 15, 2013

(65) Prior Publication Data
US 2014/0103346 A1   Apr. 17, 2014

(30) Foreign Application Priority Data

Oct. 17, 2012   (JP) ................................. 2012-230361

(51) Int. Cl.
*H01L 29/786* (2006.01)
*H01L 29/66* (2006.01)
*H01L 29/417* (2006.01)
*H01L 29/45* (2006.01)
*H01L 29/49* (2006.01)

(52) U.S. Cl.
CPC ...... *H01L 29/7869* (2013.01); *H01L 29/41733* (2013.01); *H01L 29/45* (2013.01); *H01L 29/4908* (2013.01); *H01L 29/66969* (2013.01); *H01L 29/78693* (2013.01); *H01L 29/78696* (2013.01)

(58) Field of Classification Search
CPC ............ H01L 27/1225; H01L 29/7869; H01L 29/78696
See application file for complete search history.

(56) References Cited

U.S. PATENT DOCUMENTS

| 5,528,056 A | 6/1996 | Shimada et al. |
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO-TFT Channel," Extended Abstracts (The 57$^{th}$ Spring Meeting 2010), The Japan Society of Applied Physics and Related Societies, Mar. 17, 2010, pp. 21-008.

(Continued)

*Primary Examiner* — John C Ingham
(74) *Attorney, Agent, or Firm* — Robinson Intellectual Property Law Office, P.C.; Eric J. Robinson

(57) ABSTRACT

A semiconductor device includes a transistor which includes a gate electrode, a gate insulating film in contact with the gate electrode, and a stacked-layer oxide film facing the gate electrode with the gate insulating film provided therebetween. In the semiconductor device, the stacked-layer oxide film includes at least a plurality of oxide films, at least one of the plurality of oxide films includes a channel formation region, a channel length of the transistor is greater than or equal to 5 nm and less than 60 nm, and a thickness of the gate insulating film is larger than a thickness of the oxide film including the channel formation region.

19 Claims, 18 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0295042 A1* | 11/2010 | Yano et al. ............ 257/43 |
| 2010/0320458 A1 | 12/2010 | Umeda et al. |
| 2010/0320459 A1 | 12/2010 | Umeda et al. |
| 2011/0114914 A1* | 5/2011 | Numata et al. ............ 257/9 |
| 2011/0127523 A1 | 6/2011 | Yamazaki |
| 2011/0140100 A1 | 6/2011 | Takata et al. |
| 2011/0156026 A1* | 6/2011 | Yamazaki et al. ............ 257/43 |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0132905 A1* | 5/2012 | Yamazaki ............ 257/43 |
| 2013/0140554 A1 | 6/2013 | Yamazaki et al. |
| 2013/0181214 A1 | 7/2013 | Yamazaki et al. |
| 2013/0320330 A1 | 12/2013 | Yamazaki |
| 2014/0077205 A1 | 3/2014 | Yamazaki et al. |
| 2014/0084287 A1 | 3/2014 | Yamazaki |
| 2014/0091301 A1 | 4/2014 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-206971 A | 7/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-274378 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-253440 A | 9/2006 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2012-160679 | 8/2012 |

(56) References Cited

FOREIGN PATENT DOCUMENTS

| | | |
|---|---|---|
| WO | WO-2004/114391 | 12/2004 |
| WO | WO 2008/133345 | 11/2008 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID Internatonal Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo. Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 3, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner $d_{GI} > d_{S2}$ $d_{GI} > d_{S2}$

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means all types of devices that can function by utilizing semiconductor characteristics, and an electro-optical device, a semiconductor circuit, and an electronic device are all semiconductor devices.

2. Description of the Related Art

A metal oxide silicon field-effect transistor (MOSFET), which is formed over a silicon substrate, has been applied to a wide range of electronic devices such as an integrated circuit (IC) and an image display device (display device).

A MOSFET including a silicon semiconductor has been miniaturized in order to improve its element characteristics. A short channel length of a MOSFET improves cutoff frequency f, which increases its operation speed. Moreover, the degree of integration of the MOSFET is improved.

However, there is a problem in that as the channel length of the MOSFET is shorter, a short-channel effect, such as a punch-through phenomenon or a change in threshold voltage, occurs.

Various countermeasures against the short-channel effect have been proposed. For example, when the thickness of a gate insulating film is small, a gate electrode layer can be close to a channel region, and thus influence of a gate electrode on the channel region is enhanced, which can suppress the short-channel effect. Accordingly, reduction in the thickness of the gate insulating film, which suppresses the short-channel effect, has been used as an effective technique for the MOSFET.

However, reduction in the thickness of the gate insulating film (3 nm or less, for example) causes a problem of a tunnel current passing through the gate insulating film. To solve this problem, study in which instead of silicon oxide, a high-k material (e.g., a hafnium oxide) which has a higher permittivity than silicon oxide is used as a material of the gate insulating film has been conducted (e.g., see Patent Documents 1 and 2). With the use of the high-k material, effective thickness which is obtained by conversion into a film thickness of silicon oxide (referred to as equivalent oxide thickness (EOT)) of the gate insulating film can be reduced (to 3 nm or less, for example) while physical thickness thereof can be large enough to prevent occurrence of a tunnel current.

Furthermore, in general, a countermeasure called channel doping in which a small amount of an impurity element such as phosphorus or boron is added to the whole of a shallow channel formation region of the MOSFET has been employed (e.g., see Patent Document 3).

REFERENCE

Patent Document

[Patent Document 1] Japanese Published Patent Application No. 2001-274378

[Patent Document 2] Japanese Published Patent Application No. 2006-253440

[Patent Document 3] Japanese Published Patent Application No. H4-206971

SUMMARY OF THE INVENTION

As described above, various countermeasures against the short-channel effect have been taken, but the countermeasures also cause problems.

For example, the channel doping has a disadvantage that an intentionally added impurity element inhibits transport of carriers, which results in a significantly decrease of carrier mobility. This causes a problem of great decrease in field-effect mobility of the MOSFET.

In view of the above, an object of one embodiment of the present invention is to provide a semiconductor device including a transistor which is miniaturized and has high field-effect mobility.

One embodiment of the present invention is a semiconductor device including a transistor which includes a stacked film, in which oxide semiconductor films are stacked, including a channel formation region; a gate insulating film; and a gate electrode layer. The channel length of the transistor is short, and the thickness of the gate insulating film is larger than the thichness of an oxide film including a region where a channel is formed in the stacked-layer oxide film.

One embodiment of the present invention is a semiconductor device including a transistor which includes a gate electrode, a gate insulating film in contact with the gate electrode, and a stacked-layer oxide film facing the gate electrode with the gate insulating film provided therebetween. In the semiconductor device, the stacked-layer oxide film includes at least a plurality of oxide films, at least one of the plurality of oxide films includes a channel formation region, a channel length of the transistor is greater than or equal to 5 nm and less than 60 nm, and a thickness of the gate insulating film is larger than a thickness of the oxide film including the channel formation region.

One embodiment of the present invention relates to a semiconductor device including a transistor or a semiconductor device including a circuit including a transistor. For example, one embodiment of the present invention relates to a semiconductor device including a transistor in which a channel formation region is formed in a stacked-layer film including oxide semiconductor films or a semiconductor device including a circuit including such a transistor. For example, one embodiment of the present invention relates to an electronic device which includes, as a component, an LSI; a CPU; a power device mounted on a power supply circuit; a semiconductor integrated circuit including a memory, a thyristor, a converter, an image sensor, or the like; an electro-optical device typified by a liquid crystal display panel; or a light-emitting display device including a light-emitting element.

In view of the above, an object of one embodiment of the present invention is to provide a semiconductor device including a transistor which is miniaturized and has high field-effect mobility.

DETAILED DESCRIPTION OF THE INVENTION

Hereinafter, embodiments of the invention disclosed in this specification are described in detail with reference to the accompanying drawings. However, the invention disclosed in this specification is not limited to the following description, and it is easily understood by those skilled in the art that modes and details disclosed herein can be modified in various ways. Therefore, the invention disclosed in this specification is not construed as being limited to description of the embodiments. The ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one embodiment of a semiconductor device is described with reference to FIGS. 1A and 1B. In this embodiment, a transistor including a stacked-layer oxide film is shown as an example of the semiconductor device.

The transistor may have a top-gate structure or a bottom-gate structure, and may have a single-gate structure in which one channel formation region is formed, a double-gate structure in which two channel formation regions are formed, or a triple-gate structure in which three channel formation regions are formed. Furthermore, the transistor may have a dual-gate structure including two gate electrodes positioned above and below a channel formation region with gate insulating films provided therebetween. Moreover, the transistor may be a channel protective transistor in which a protective film is provided over a channel formation region.

Figure 1A:
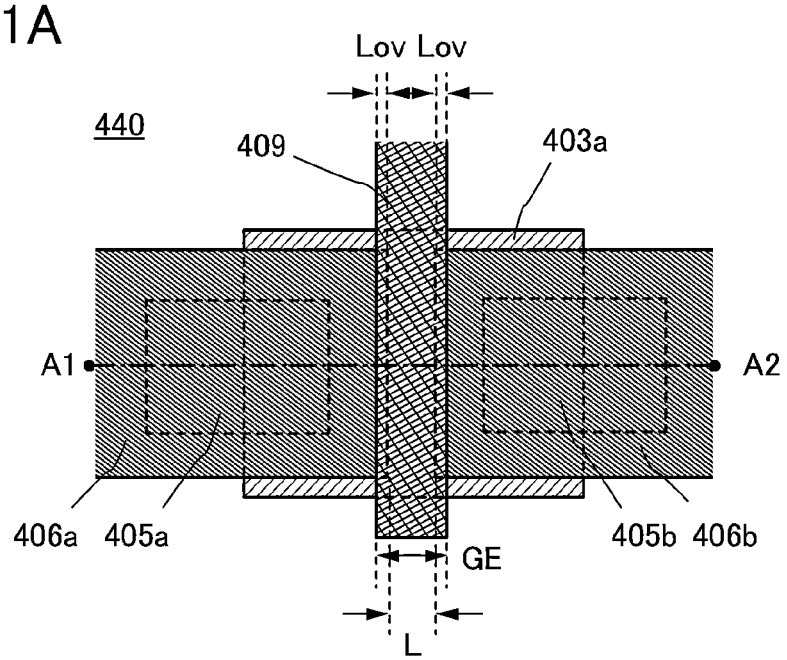
FIGS. 1A and 1B are a plan view and a cross-sectional view of one embodiment of a semiconductor device.
Figure 1B:
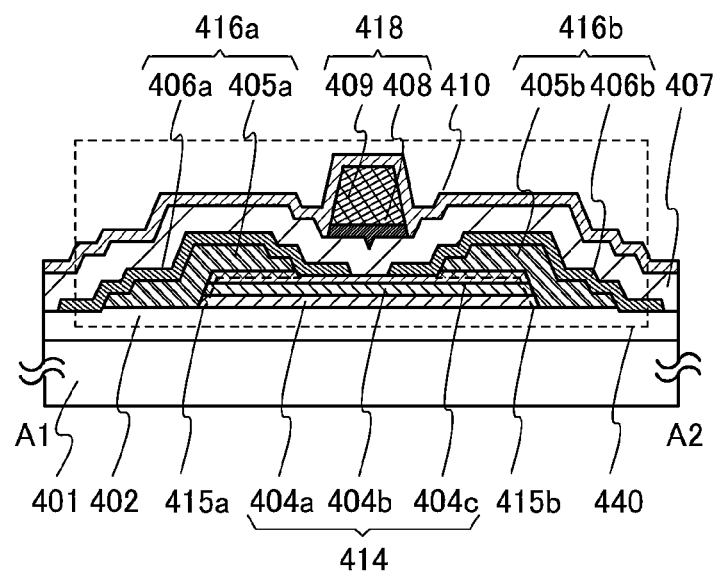

A transistor 440 illustrated in FIGS. 1A and 1B is an example of a top-gate transistor. FIG. 1A is a plan view of the transistor 440. FIG. 1B is a cross-sectional view taken along A1-A2 in FIG. 1A. Note that in FIG. 1A, some components of the transistor 440 are not illustrated in order to avoid complexity.

As illustrated in FIG. 1B which is a cross-sectional view in the channel length direction, the transistor 440 includes, over a substrate 401 which is provided with an insulating film 402 to have an insulating surface, a stacked-layer oxide film 414; a source electrode 416a and a drain electrode 416b which are in contact with the stacked-layer oxide film 414; a gate insulating film 407 over the stacked-layer oxide film 414, the source electrode 416a, and the drain electrode 416b; and a gate electrode 418 which overlaps with the stacked-layer oxide film 414 with the gate insulating film 407 provided therebetween. In FIG. 1B, an insulating film 410 is provided to cover the transistor 440.

As illustrated in FIG. 1B, the stacked-layer oxide film 414 is formed by stacking oxide semiconductor films. For example, the stacked-layer oxide film 414 has a structure in which three layers, i.e., an oxide film 404a, an oxide film 404b, and an oxide film 404c, are stacked in this order.

The source electrode 416a and the drain electrode 416b each have a stacked structure. The source electrode 416a has a stacked structure of a conductive layer 405a and a conductive layer 406a. The drain electrode 416b has a stacked structure of a conductive layer 405b and a conductive layer 406b. The gate electrode 418 has a stacked structure of a conductive layer 408 and a conductive layer 409.

The transistor 440 has a short channel length L; the thickness of the gate insulating film 407 is larger than the thickness of a region in the stacked-layer oxide film where a channel is formed, i.e., the thickness of the oxide film 404b.

In this specification and the like, in a region of the stacked-layer oxide film 414 where the stacked-layer oxide film 414 overlaps with the gate electrode 418, a distance between the source electrode 416a and the drain electrode 416b (specifically, a distance between the conductive layer 406a and the conductive layer 406b) is called channel length L. In one embodiment of the present invention, the channel length L is greater than or equal to 5 nm and less than 60 nm, preferably greater than or equal to 10 nm and less than or equal to 40 nm.

Here, a channel formation region and a channel which are formed in the stacked-layer oxide film are described.

Figure 16A:
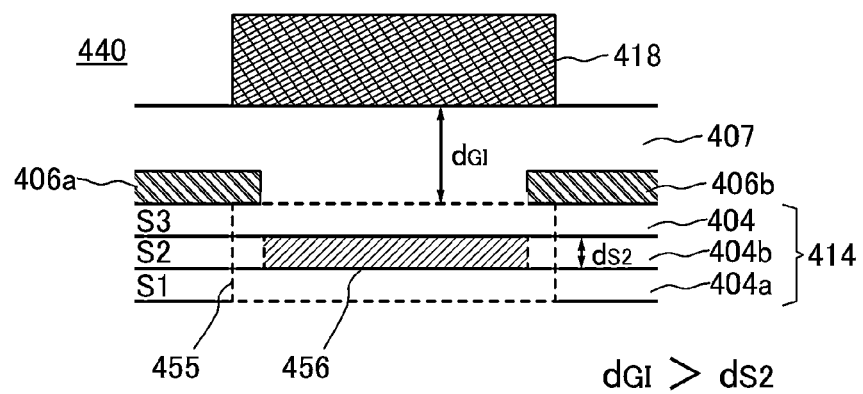
FIGS. 16A and 16B are schematic views of semiconductor devices.

FIG. 16A is a schematic enlarged view of the stacked-layer oxide film 414 of the transistor 440. Note that the gate electrode, which has a stacked structure in FIGS. 1A and 1B, has a single layer structure in FIG. 16A for convenience.

As illustrated in FIG. 16A, a region in the stacked-layer oxide film 414 which overlaps with the gate electrode 418 and is sandwiched between the source electrode and the drain electrode (specifically, a region sandwiched between the conductive layer 406a and the conductive layer 406b) is called a channel formation region 455. A channel 456 refers to a region through which current mainly flows in the channel formation region 455. Here, the channel 456 corresponds to the oxide film 404b in the channel formation region 455.

The thickness of the oxide film 404a is greater than or equal to 3 nm and less than or equal to 100 nm, preferably greater than or equal to 3 nm and less than or equal to 50 nm. The thickness of the oxide film 404b is greater than or equal to 3 nm and less than or equal to 200 nm, preferably greater than or equal to 3 nm and less than or equal to 100 nm, further preferably greater than or equal to 5 nm and less than or equal to 15 nm. The thickness of the oxide film 404c is greater than or equal to 3 nm and less than or equal to 100 nm, preferably greater than or equal to 3 nm and less than or equal to 50 nm. Therefore, the thickness of the stacked-layer oxide film 414 is greater than or equal to 9 nm and less than or equal to 400 nm, preferably greater than or equal to 20 nm and less than or equal to 40 nm.

In one embodiment of the present invention, a thickness dGI of the gate insulating film 407 is at least larger than a thickness dS2 of the oxide film 404b. Thus, the thickness dGI of the gate insulating film 407 is determined depending on the thickness dS2 of the oxide film 404b. The equivalent oxide thickness of the gate insulating film 407 is, for example, greater than or equal to 5 nm and less than or equal to 50 nm, preferably greater than or equal to 20 nm and less than or equal to 30 nm. The thickness may exceed 200 nm.

Figure 16B:
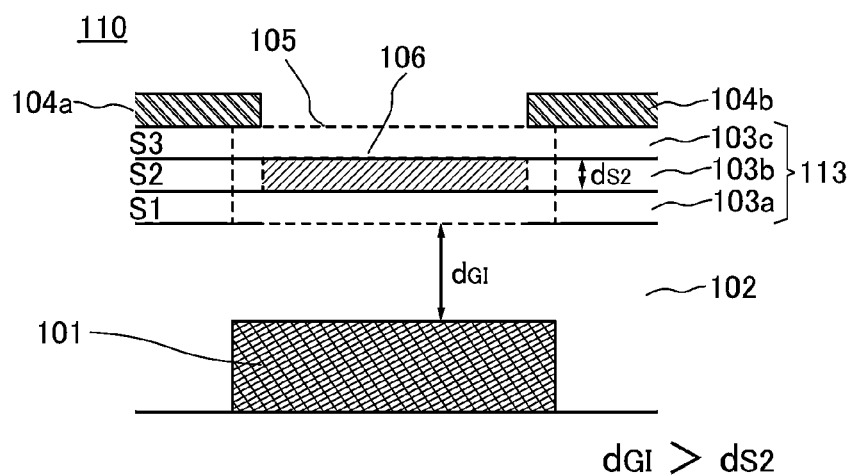

Note that FIG. 16B is a schematic view of a bottom-gate transistor.

In the case of a bottom gate transistor 110, as illustrated in FIG. 16B, a gate insulating film 102 is provided over a gate electrode 101; a stacked-layer oxide film 113 formed by stacking an oxide film 103a, an oxide film 103b, and an oxide film 103c in this order is provided over the gate insulating film 102; and a source electrode 104a and a drain electrode 104b are provided in contact with the stacked-layer oxide film 113.

As illustrated in FIG. 16B, a region in the stacked-layer oxide film 113 which overlaps with the gate electrode 101 and is sandwiched between the source electrode 104a and the drain electrode 104b is called a channel formation region 105. A channel 106 refers to a region through which current mainly flows in the channel formation region 105. Here, the channel 106 corresponds to the oxide film 103b in the channel formation region 105.

The thickness dGI of the gate insulating film 102 is at least larger than the thickness dS2 of the oxide film 103b. Thus, the thickness dGI of the gate insulating film 102 is determined depending on the thickness dS2 of the oxide film 103b. The equivalent oxide thickness of the gate insulating film 102 is, for example, greater than or equal to 5 nm and less than or equal to 50 nm, preferably greater than or equal to 20 nm and less than or equal to 30 nm. The thickness may exceed 200 nm.

Next, the stacked-layer oxide film 414 is described in detail.

The oxide film 404a contains one or more kinds of elements contained in the oxide film 404b. The energy at the bottom of the conduction band of the oxide film 404a is closer to the vacuum level than that of the oxide film 404b by 0.05 eV or more, 0.07 eV or more, 0.1 eV or more, or 0.15 eV or more and 2 eV or less, 1 eV or less, 0.5 eV or less, or 0.4 eV or less. Since the oxide film 404a contains one or more kinds of elements contained in the oxide film 404b, interface state is less likely to be generated at an interface between the oxide film 404b and the oxide film 404a. If the interface has an interface state, a second transistor having a channel at the interface and having a different threshold voltage might be formed, and an apparent threshold voltage of the transistor might be changed. Therefore, when the oxide film 404a is provided, variation in electric characteristics such as threshold voltage among transistors can be reduced.

The oxide film 404c contains one or more kinds of elements contained in the oxide film 404b. The energy at the bottom of the conduction band of the oxide film 404c is closer to the vacuum level than that of the oxide film 404b by 0.05 eV or more, 0.07 eV or more, 0.1 eV or more, or 0.15 eV or more and 2 eV or less, 1 eV or less, 0.5 eV or less, or 0.4 eV or less. Note that the oxide film 404b preferably contains at least indium in order to increase the carrier mobility. When an electric field is applied to the gate electrode 418 at this time, a channel is formed in the oxide film 404b of the stacked-layer oxide film 414, whose energy at the bottom of the conduction band is low. Thus, the oxide film 404c is provided between the oxide film 404b and the gate insulating film 407, a channel of the transistor can be formed in the oxide film 404b which is not in contact with the gate insulating film 407. Furthermore, since the oxide film 404c contains one or more kinds of elements contained in the oxide film 404b, interface scattering is less likely to occur at an interface between the oxide film 404b and the oxide film 404c. The carrier transfer is not hindered at the interface, so that the transistor can have high field-effect mobility.

Note that in the case where the oxide film 404a is an In-M-Zn oxide, the atomic ratio of In to M is preferably as follows: the proportion of In is less than 50 atomic % and the proportion of M is greater than or equal to 50 atomic %; more preferably, the proportion of In is less than 25 atomic % and the proportion of M is greater than or equal to 75 atomic %. In the case where the oxide film 404b is an In-M-Zn oxide, the atomic ratio of In to M is preferably as follows: the proportion of In is greater than or equal to 25 atomic % and the proportion of M is less than 75 atomic %; more preferably, the proportion of In is greater than or equal to 34 atomic % and the proportion of M is less than 66 atomic %. In the case where the oxide film 404c is an In-M-Zn oxide, the atomic ratio of In to M is preferably as follows: the proportion of In is less than 50 atomic % and the proportion of M is greater than or equal to 50 atomic %; more preferably, the proportion of In is less than 25 atomic % and the proportion of M is greater than or equal to 75 atomic %.

For example, each of the oxide film 404a and the oxide film 404c may contain, as its main elements, elements (indium, gallium, and zinc) contained in the oxide film 404b, and have a higher proportion of gallium than the oxide film 404b. Specifically, as each of the oxide film 404a and the oxide film 404c, an oxide film having a proportion of gallium 1.5 times or more, preferably 2 times or more, further preferably 3 times or more the proportion of gallium in the oxide film 404b is used. Gallium is firmly bonded to oxygen, and thus has a function of suppressing generation of oxygen vacancies in the oxide film. Therefore, oxygen vacancies are less likely to occur in the oxide film 404a and the oxide film 404c than in the oxide film 404b.

Oxide films which satisfy the above conditions are formed as the oxide film 404a, the oxide film 404b, and the oxide film 404c, whereby the stacked-layer oxide film 414 whose energy at the bottom of the conduction band has a well-shaped structure can be formed. Thus, in the transistor including the stacked-layer oxide film 414, a channel is formed in the oxide film 404b.

Each of the oxide film 404a, the oxide film 404b, and the oxide film 404c may be an amorphous oxide semiconductor film, a single crystal oxide semiconductor film, a polycrystalline oxide semiconductor film, a microcrystalline oxide semiconductor film, or a c axis aligned crystalline oxide semiconductor (CAAC-OS) film. Note that CAAC-OS is described in the following embodiment.

In the transistor 440, in the case where the oxide film 404b is a CAAC-OS film including crystal parts, the oxide film 404a and the oxide film 404c do not necessarily have crystallinity, and may be amorphous oxide films. For example, the oxide film 404a can be an amorphous oxide film and the oxide film 404b and the oxide film 404c can be CAAC-OS films. A CAAC-OS film is used as the oxide film 404b in which a channel is formed, in which case the transistor can have stable electric characteristics.

In the transistor 440, a length in the channel length L direction (denoted by Lov in FIG. 1A) of a region in the stacked-layer oxide film 414 where the gate electrode 418 overlaps with the source electrode 416a or the drain electrode 416b (specifically, the conductive layer 406a or the conductive layer 406b) is preferably short. For example, Lov is higher than 0% and less than 20% of the channel length L, preferably greater than or equal to 5% and less than 10% of the channel length. With such a structure, parasitic capacitance generated between the gate electrode 418 and the drain electrode 416b can be small.

The resistance of regions in the stacked-layer oxide film 414 which are in contact with the source electrode 416a and the drain electrode 416b (specifically, the conductive layer 405a and the conductive layer 405b) might be decreased (the regions might have n-type conductivity). In FIG. 1B, regions in the stacked-layer oxide film 414 which are in contact with the conductive layer 405a and the conductive layer 405b are indicated by dotted lines. Such regions are called a low-resistance region 415a and a low-resistance region 415b. Each of the low-resistance region 415a and the low-resistance region 415b is formed in a region at 2 nm to 5 nm from a surface of the stacked-layer oxide film 414 in contact with the conductive layer 405a or the conductive layer 405b. When heat treatment is performed in a state where the stacked-layer oxide film 414 is in contact with the conductive layer 405a and the conductive layer 405b, depending on materials of the conductive layer 405a and the conductive layer 405b, the conductive layer 405a and the conductive layer 405b remove oxide from part of the stacked-layer oxide film 414. In the stacked-layer oxide film 414, oxygen vacancies are formed in regions where oxygen is removed, and many carriers are generated.

The low-resistance region 415a and the low-resistance region 415b each serve as a source region or a drain region. In the case where the stacked-layer oxide film 414 includes the low-resistance region 415a and the low-resistance region 415b as described above, in a region in the stacked-layer oxide film 414 overlapping with the gate electrode 418, a distance between the low-resistance region 415a and the low-resistance region 415b can be called channel length L.

In the low-resistance region 415a and the low-resistance region 415b, the stacked-layer oxide film 414 is electrically connected to the source electrode 416a and the drain electrode 416b, in which case contact resistance between the stacked-layer oxide film 414 and the source electrode 416a and the drain electrode 416b can be reduced. Moreover, an electric field applied to a channel formed between the low-resistance region 415a and the low-resistance region 415b can be relaxed.

In the stacked-layer oxide film 414, hydrogen, nitrogen, carbon, silicon, and a metal element other than main components are impurities. In order to reduce the concentration of impurities in the stacked-layer oxide film 414, it is preferable to reduce the concentration of impurities in the gate insulating film 407 and the insulating film 402 which are adjacent to the stacked-layer oxide film 414. For example, silicon in the stacked-layer oxide film 414 forms an impurity state. In addition, the impurity state may serve as a trap, leading to deterioration of electric characteristics of the transistor in some cases.

Therefore, the concentration of hydrogen in each oxide film, which is measured by secondary ion mass spectrometry (SIMS), should be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in each oxide film, which is measured by SIMS, should be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The concentration of carbon in each oxide film, which is measured by SIMS, should be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The concentration of silicon in each oxide film, which is measured by SIMS, should be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

It is preferable that at least the oxide film 404b in the stacked-layer oxide film 414 where the channel of the transistor is formed be highly purified by reducing the concentration of impurities and by reducing oxygen vacancies in the oxide film 404b. The oxide film 404b which is highly purified is i-type (intrinsic) semiconductor or substantially i-type semiconductor. The carrier density of an oxide film which is substantially i-type is lower than $1 \times 10^{17}$/cm$^3$, lower than $1 \times 10^{15}$/cm$^3$, or lower than $1 \times 10^{13}$/cm$^3$.

The off-state current of a transistor manufactured using the above oxide film for a channel formation region can be sufficiently reduced (here, the off-state current means a drain current when a potential difference between a source and a gate is equal to or lower than the threshold voltage in the off state, for example). With the use of a highly purified oxide film, the off-state current density of the transistor at 85° C. can be less than 1 zA/μm, preferably less than 1 yA/μm.

As described above, the oxide films 404a to 404c, which form the stacked-layer oxide film 414 disclosed in this specification and the like, are oxide semiconductor films having unique physical properties, and include semiconductors which are completely different from a silicon semiconductor. Table 1 compares a MOSFET including a silicon semiconductor with a MOSFET including the stacked-layer oxide film 414. Note that in Table 1, an n-channel MOSFET including a silicon semiconductor is referred to as Si(nMOS), and an n-channel MOSFET including the stacked-layer oxide film 414 is referred to as OS(nMOS).

TABLE 1

| | Si(nMOS) | OS(nMOS) |
|---|---|---|
| buried-channel | no | yes |
| surface scattering | yes | no |
| impurity scattering | yes | no |
| channel doping | yes | no |
| LDD | yes | no |

As described above, in a MOSFET including silicon, a short-channel effect occurs with miniaturization. When the thickness of a gate insulating film is small, a gate electrode layer can be close to a channel region, and thus influence of a gate electrode layer on the channel region is enhanced, which can suppress the short-channel effect. Accordingly, reduction in the thickness of the gate insulating film, which improves the operation speed and the degree of integration of a MOSFET and suppresses a short-channel effect of the MOSFET, has been used as an effective technique for the MOSFET.

Although reduction in the thickness of the gate insulating film (e.g., 3 nm or less) is effective in suppressing a short-channel effect, a tunnel current passing through the gate insulating film is generated. Therefore, in the MOSFET including silicon, when the thickness of a gate insulating film, such as an insulating film containing silicon oxide (e.g., a silicon oxide film or a silicon oxide film containing nitrogen), is not reduced, a depletion layer is less likely to extend and thus high-speed operation is difficult; on the other hand, when the thickness of the gate insulating film is reduced, a tunnel current is generated. Accordingly, to achieve high-speed operation and ensure the reliability, a high-k material (whose relative permittivity is about 20 to 30, for example) having a higher permittivity than the insulating film containing silicon oxide (whose relative permittivity is 3.8 to 4.1, for example) is used for the gate insulating film without reduction in the thickness of the gate insulating film.

In contrast to this, the oxide films 404a to 404c which form the stacked-layer oxide film 414 have a small number of minority carriers. For this reason, in the MOSFET including the stacked-layer oxide film 414, a depletion layer is likely to extend over an extremely large area. Therefore, the use of the high-k material having a high permittivity for the gate insulating film is not needed, and an insulating film having an equivalent oxide thickness of greater than or equal to 5 nm and less than or equal to 50 nm, preferably greater than or equal to 20 nm and less than or equal to 30 nm can be used. Even with the use of an insulating film with the equivalent oxide thickness, a depletion layer of the stacked-layer oxide film extends over an extremely large area, which makes high-speed operation of the MOSFET possible, and a tunnel current is not generated and thus leakage current is also not generated, which leads to high reliability. Furthermore, defects in shape, such as poor coverage, due to reduction in the thickness of the gate insulating film can be also suppressed, thereby suppressing variations in yield and characteristics.

With the use of the stacked-layer oxide film 414, a "buried-channel" transistor in which a channel is formed in the oxide film 404b can be formed. In the buried-channel transistor, carriers transfer not at an interface between the stacked-layer oxide film 414 and the gate insulating film 407 but in the oxide film 404b. For this reason, reduction in carrier mobility due to surface scattering does not occur, so that higher field-effect mobility than that of a surface-channel transistor can be obtained.

The MOSFET including the stacked-layer oxide film 414 does not require a channel doping step which is needed for the MOSFET including silicon. Moreover, an impurity such as hydrogen or silicon is reduced in the stacked-layer oxide film 414. Thus, carrier transfer is not inhibited, so that the field-effect mobility of the MOSFET including the stacked-layer oxide film 414 can be improved.

In the MOSFET including silicon, power supply voltage cannot be decreased by miniaturization of the MOSFET. For this reason, high drain voltage is applied to a channel region of a short channel transistor. Thus, electrons with high energy (hot electrons) are generated. When hot electrons are injected into the gate insulating film, trapping of charges and interface state are generated, and degradation in electric characteristics of the transistor, such as a change in threshold voltage or gate leakage current, occurs. Such degradation in electric characteristics caused by hot carriers is called hot-carrier degradation. In order to suppress hot-carrier degradation in a MOSFET including bulk silicon, it is necessary to employ an LDD structure in which an electric field is relaxed by decreasing the impurity concentration in the drain region.

In contrast to this, the energy gap of the oxide semiconductor film is 2.8 eV to 3.2 eV, which is extremely large as compared with the energy gap of silicon (1.1 eV). In the transistor including the stack of oxide semiconductors films, avalanche breakdown is less likely to occur; thus, the transistor including the stacked-layer oxide film can have high resistance to hot-carrier degradation as compared with the transistor including silicon. Therefore, an LDD structure does not need to be formed in the stacked-layer oxide film 414.

Accordingly, the field-effect mobility of the transistor including the stacked-layer oxide film can be improved even when the transistor is miniaturized.

This embodiment can be implemented in appropriate combinations with any of the other embodiments.

Embodiment 2

In this embodiment, the oxide semiconductor films described in the above embodiment, the stacked-layer oxide film formed by the oxide semiconductor films, a method for forming the stacked-layer oxide film, and a band structure of the stacked-layer oxide film are described with reference to FIGS. 2A and 2B and FIGS. 3A and 3B.

A structure of an oxide semiconductor film is described below.

An oxide semiconductor film is roughly classified into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of the CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. When an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element (e.g., silicon) that has higher bonding strength to oxygen than a metal element included in the oxide semiconductor film disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. For example, oxygen vacancies in the oxide semiconductor film might serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electric characteristics and has high reliability. Note that charge trapped by the carrier traps in the oxide semiconductor film takes a long time to be released and might behave like fixed charge. Thus, a transistor including the oxide semiconductor film having high impurity concentration and a high density of defect states has unstable electric characteristics in some cases.

With the use of the CAAC-OS film in a transistor, variation in the electric characteristics of the transistor due to irradiation with visible light or ultraviolet light is small.

Next, a microcrystalline oxide semiconductor film is described.

In a TEM image of the microcrystalline oxide semiconductor film, crystal parts cannot be found clearly in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, a crystal grain cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak indicating a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part (e.g., larger than or equal to 1 nm and smaller than or equal to 30 nm). Further, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect levels than the amorphous oxide semiconductor film. However, there is no regularity of crystal orientation between different crystal parts in the nc-OS film; hence, the nc-OS film has a higher density of defect levels than the CAAC-OS film.

Note that an oxide semiconductor film may be a stacked film including two or more films of an amorphous oxide semiconductor film, a microcrystalline oxide semiconductor film, and a CAAC-OS film, for example.

Next, a method for forming the CAAC-OS film is described.

In the CAAC-OS film, defects in the bulk can be reduced and when the surface flatness of an oxide film is improved, mobility higher than or equal to that of an amorphous oxide film can be obtained. In order to improve the surface flatness, the oxide film is preferably formed on a flat surface. Specifically, the oxide film is preferably formed on a surface with an average surface roughness ($R_a$) of less than or equal to 1 nm, preferably less than or equal to 0.3 nm, more preferably less than or equal to 0.1 nm.

Note that $R_a$ is obtained by expanding the arithmetic means surface roughness that is defined by JIS B 0601:2001 (ISO 4287:1997) into three dimensions so as to be able to be applied to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x,y) - Z_0| dx dy \quad \text{[Formula 1]}$$

Here, the specific surface is a surface which is a target of roughness measurement, and is a quadrilateral region which is specified by four points represented by the coordinates $(x_1, y_1, f(x_1,y_1))$, $(x_1, y_2, f(x_1,y_2))$, $(x_2, y_1, f(x_2,y_1))$, and $(x_2, y_2, f(x_2,t_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

To form an oxide film on a flat surface, planarization treatment may be performed on a surface where the oxide film is to be formed. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with the use of an RF power supply in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. By the reverse sputtering, powder substances (also referred to as particles or dust) which are attached to the surface on which the oxide film is to be formed can be removed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface on which the oxide film is to be formed.

Each of the oxide films which form the stacked-layer oxide film can be formed by a sputtering method, a molecular beam epitaxy (MBE) method, a CVD method, a pulse laser deposition method, an atomic layer deposition (ALD) method, or the like as appropriate.

Here, the case where each oxide film is formed with a sputtering apparatus is described as an example.

As a sputtering gas used for forming each oxide film, it is preferable to use a gas whose dew point is less than or equal to $-80°$ C., preferably less than or equal to $-100°$ C., further preferably less than or equal to $-120°$ C. With the use of an oxygen gas, a rare gas (e.g., an argon gas), or the like whose dew point is low, moisture entering the film at the time of deposition can be reduced.

In the case where an In—Ga—Zn—O compound target is used as a sputtering target, an In—Ga—Zn—O compound target is preferably used which is formed by mixing an InO$_x$ powder, a GaO$_y$ powder, and a ZnO$_z$ powder at a molar ratio of 2:2:1, 8:4:3, 3:1:1, 1:1:1, 4:2:3, or 3:1:2, for example, where x, y, and z are each a given positive number.

The substrate is held in a deposition chamber kept under reduced pressure. Then, a sputtering gas from which impurities such as hydrogen and moisture are removed is introduced into the deposition chamber from which remaining moisture is being removed, and an oxide film is formed over the substrate with the use of the target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities in the oxide film formed in the deposition chamber can be reduced.

In the case where the CAAC-OS film is used as an oxide film in the stacked-layer oxide film, the CAAC-OS film is formed by a sputtering method with a polycrystalline oxide semiconductor sputtering target, for example. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, so that the crystal state of the sputtering target is transferred to the substrate; thereby forming the CAAC-OS film.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced.

Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

Accordingly, the CAAC-OS film can be formed.

Note that as described in the above embodiment, the stacked-layer oxide film is formed by an amorphous oxide film, a single crystal oxide film, and a polycrystalline oxide film in addition to a CAAC-OS film.

For example, in the stacked-layer oxide film 414 illustrated in FIGS. 1A and 1B, in the case where the oxide film 404b is a CAAC-OS film, the oxide film 404a and the oxide film 404c do not necessarily have crystallinity. For example, the oxide film 404b may be a CAAC-OS film, and the oxide film 404a and the oxide film 404c may be amorphous oxide films. Alternatively, the oxide film 404a may be an amorphous oxide film, and the oxide film 404b and the oxide film 404c may be CAAC-OS films.

The crystallinity of an oxide film is influenced by the crystallinity of another oxide film formed below the oxide film in some cases. For example, an oxide film formed over a CAAC-OS film readily becomes a CAAC-OS film. As described above, an oxide film readily becomes a CAAC-OS film by being formed over an oxide film with high surface flatness. Therefore, when an amorphous oxide film whose surface can be flat relatively easily is formed as the oxide film 404a, and the oxide film 404b is formed over the amorphous oxide film, the oxide film 404b readily becomes a CAAC-OS film. In addition, when the oxide film 404c is formed over the CAAC-OS film, the oxide film 404c readily becomes a CAAC-OS film. Note that in the case where the oxide film 404a is a CAAC-OS film, the insulating film 402 is preferably amorphous.

Here, an energy band structure of the stacked-layer oxide film 414 is described with reference to FIGS. 2A and 2B and FIGS. 3A and 3B.

First, the structure of the stacked-layer oxide film 414 for explanation of the band structure is described. An In—Ga—Zn oxide having an energy gap of 3.15 eV was used as the oxide film 404a; an In—Ga—Zn oxide having an energy gap of 2.8 eV was used as the oxide film 404b; and an oxide film having properties similar to those of the oxide film 404a was used as the oxide film 404c. The energy gap in the vicinity of the interface between the oxide film 404a and the oxide film 404b was 3 eV, and the energy gap in the vicinity of the interface between the oxide film 404c and the oxide film 404b was 3 eV. The energy gaps were measured using a spectroscopic ellipsometer (UT-300 manufactured by HORIBA Jobin Yvon). The thickness of the oxide film 404a was 10 nm; the thickness of the oxide film 404b was 10 nm; and the thickness of the oxide film 404c was 10 nm.

Figure 2A:
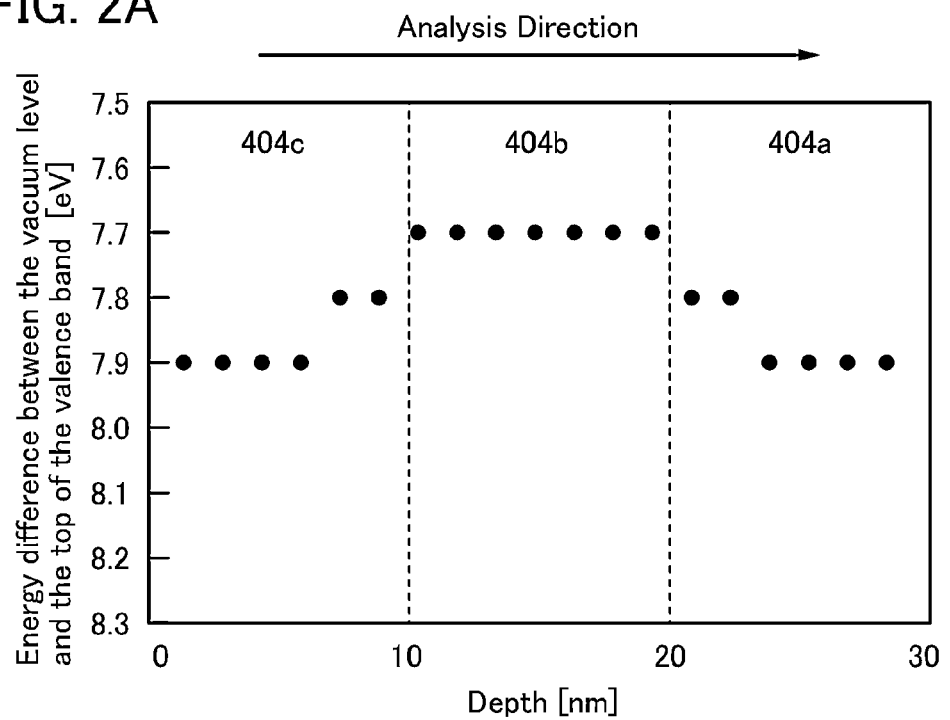
FIGS. 2A and 2B illustrate a band structure of a stacked-layer oxide film.

FIG. 2A is a graph on which values of the energy difference between the vacuum level and the top of the valence band of each layer are plotted; the values were measured using an ultraviolet photoelectron spectrometer (UPS) (VersaProbe manufactured by PHI) while the stacked-layer oxide film 414 was being etched from the oxide film 404c.

Figure 2B:
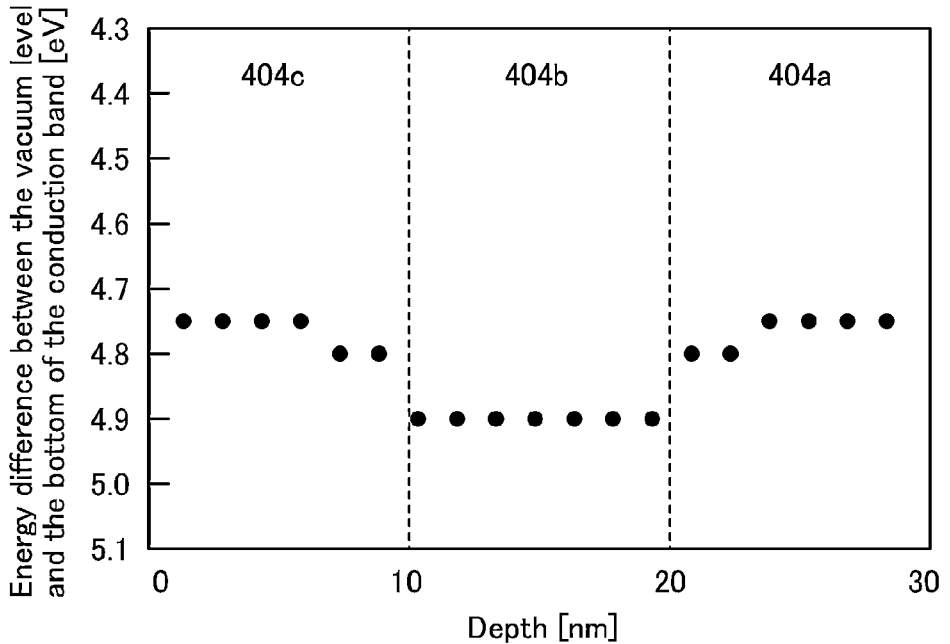

FIG. 2B is a graph on which values of the energy difference between the vacuum level and the bottom of the conduction band are plotted; the values were calculated by subtracting the energy gap of each layer from the energy difference between the vacuum level and the top of the valence band.

Figure 3A:
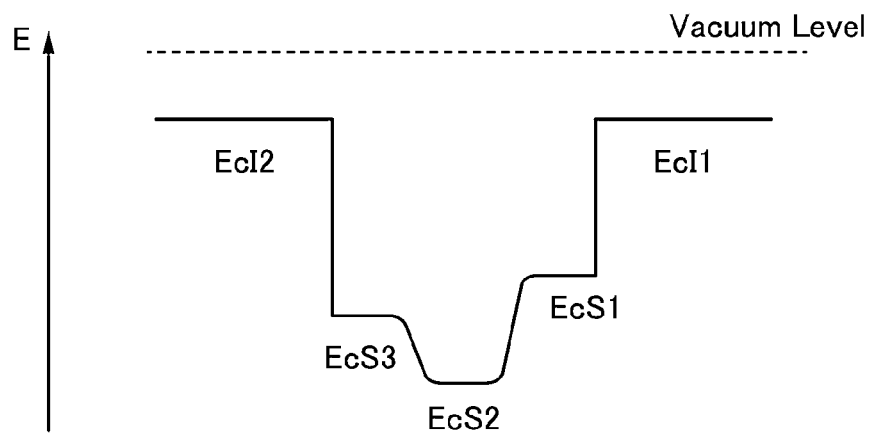
FIGS. 3A and 3B illustrate the band structure of the stacked-layer oxide film.

FIG. 3A illustrates a partial schematic band structure of FIG. 2B. With reference to FIG. 3A, a case is described in which silicon oxide films are provided in contact with the oxide film 404a and the oxide film 404c. Here, EcI1 represents the energy at the bottom of the conduction band of the silicon oxide film. EcS1 represents the energy at the bottom of the conduction band of the oxide film 404a. EcS2 represents the energy at the bottom of the conduction band of the oxide film 404b. EcS3 represents the energy at the bottom of the conduction band of the oxide film 404c. EcI2 represents the energy at the bottom of the conduction band of the silicon oxide film.

As illustrated in FIG. 3A, the energy at the bottom of the conduction band changes continuously in the oxide film 404a, the oxide film 404b, and the oxide film 404c. This is because oxygen interdiffuses between the oxide film 404a, the oxide film 404b, and the oxide film 404c.

In the case where the oxide film 404a and the oxide film 404c have different physical properties (for example, EcS1 is higher than EcS3), part of the band structure is shown in FIG. 3A. In this case, the oxide film 404a may be formed with a target having an atomic ratio of In:Ga:Zn=1:3:2; the oxide film 404b may be formed with a target having an atomic ratio of In:Ga:Zn=1:1:1; and the oxide film 404c may be formed with a target having an atomic ratio of In:Ga:Zn=1:6:4. Alternatively, the oxide film 404a may be formed with a target having an atomic ratio of In:Ga:Zn=1:3:2; the oxide film 404b may be formed with a target having an atomic ratio of In:Ga:Zn=3:1:2; and the oxide film 404c may be formed with a target having an atomic ratio of In:Ga:Zn=1:9:6.

For example, assuming that EcI2 is a gate insulating film and a gate electrode is placed left of EcI2 in the band structure illustrated in FIG. 3A, the structure preferably has an energy of the bottom of the conduction band of EcS1>EcS3 as shown in FIG. 3A. This is because current flows mainly through EcS2 near EcS3 on the gate electrode side.

In the case where the oxide film 404c and the gate electrode are provided with a silicon oxide film interposed therebetween, the silicon oxide film serves as the gate insulating film, and the oxide film 404c can prevent indium contained in the oxide film 404b from diffusing into the gate insulating film. To prevent diffusion of indium by the oxide film 404c, the proportion of indium in the oxide film 404c is preferably smaller than that in the oxide film 404b.

Although FIG. 3A shows the case of the stacked-layer oxide film in which the oxide film 404a and the oxide film 404c have different physical properties, it is possible to form the stacked-layer oxide film in which the oxide film 404a and the oxide film 404c have the same physical property. In this case, for example, the oxide film 404a may be formed with a target having an atomic ratio of In:Ga:Zn=1:3:2; the oxide film 404b may be formed with a target having an atomic ratio of In:Ga:Zn=1:1:1; and the oxide film 404c may be formed with a target having an atomic ratio of In:Ga:Zn=1:3:2.

Figure 3B:
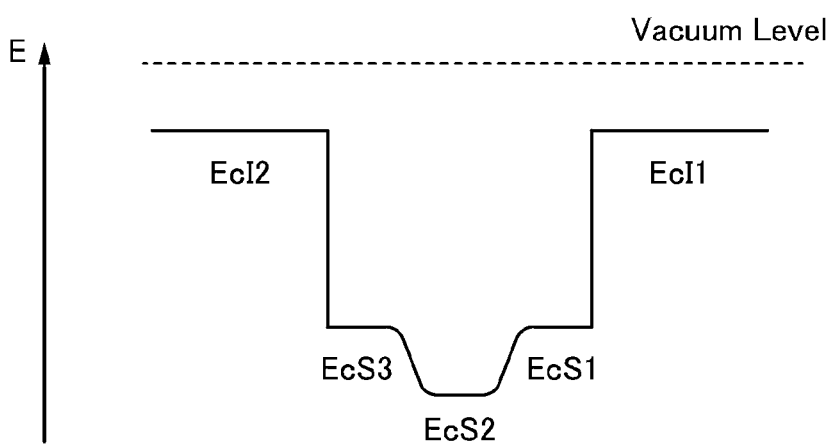

Alternatively, although not shown in FIGS. 3A and 3B, EcS3 can be higher than EcS1.

In FIGS. 2A and 2B and FIGS. 3A and 3B, in the stacked-layer oxide film 414, energies at the bottoms of conduction bands of the oxide film 404a, the oxide film 404b, and the oxide film 404c form a well-shaped structure. In the transistor including the stacked-layer oxide film 414, a channel is formed in the oxide film 404b.

Note that in FIGS. 3A and 3B, trap states resulting from impurities or defects can be formed in the vicinity of the interfaces between the oxide film 404a and an insulating film such as the silicon oxide film and between the oxide film 404c and an insulating film. Since the oxide film 404a and the oxide film 404c are provided, the oxide film 404b can be distanced from the trap states. However, in the case where the energy difference between EcS1 and EcS2 or between EcS3 and EcS2 is small, electrons in the oxide film 404b may reach the trap level by passing over the energy gap. Since the electron is trapped at the trap level, a negative fixed charge is generated, causing the threshold voltage of the transistor to be shifted in the positive direction.

Therefore, each of the energy differences between EcS1 and EcS2 and between EcS3 and EcS2 is preferably set to be larger than or equal to 0.1 eV, more preferably larger than or equal to 0.15 eV, in which case a change in the threshold voltage of the transistor can be reduced and stable electric characteristics can be obtained.

As described above, the stacked-layer oxide film 414 formed by stacking oxide films having a common main component is manufactured not simply by stacking the films, but so as to have a continuous junction (particularly, a U-shaped well structure where the energy at the bottom of the conduction band changes continuously between the films). That is, a stacked-layer structure is formed such that there exist no impurities which form a defect state such as a trap center or a recombination center, or a barrier inhibiting carrier flow, for the oxide films at each interface. If impurities are mixed between the films in the stacked-layer oxide film, the continuity of the energy band is lost and carriers disappear by being trapped or recombined at the interface.

In order to form the continuous junction, the oxide films need to be stacked successively using the above-described multi-chamber film formation apparatus including the load lock chamber, without being exposed to the air. Each chamber of the film formation apparatus is preferably evacuated to a high vacuum (about $1 \times 10^{-4}$ Pa to $5 \times 10^{-7}$ Pa) using an entrapment vacuum pump such as a cryopump in order to remove as much water or the like as possible, which is an impurity for the oxide films. Alternatively, a combination of a turbo molecular pump with a cold trap is preferable in order to prevent backflow of a gas containing carbon, moisture, or the like from a gas evacuation system into the chamber.

In order to obtain a high-purity intrinsic oxide film, it is necessary to highly purify a sputtering gas as well as to evacuate the chamber to a high vacuum. The entry of moisture or the like to the oxide film can be minimized by using, as a sputtering gas, a highly purified oxygen gas or argon gas whose dew point is −40° C. or lower, preferably −80° C. or lower, more preferably −100° C. or lower.

In addition, it is preferable that a particle separated from a sputtering target maintains a flat-plate-like shape until the particle reaches the deposition surface, and that the entry of moisture to a deposition surface be prevented by heating a substrate at 100° C. or higher. Note that in the case where alternating current (AC) or alternating current of high-frequency voltage (RF) is used as a power source, there is a moment when discharge becomes zero. For this reason, direct current (DC) is preferably used.

In the transistor of one embodiment of the present invention, the stacked-layer oxide film is preferably formed in the above manner.

This embodiment can be implemented in appropriate combinations with any of the other embodiments.

Embodiment 3

In this embodiment, a method for manufacturing the transistor 440 described in Embodiment 1 is described with reference to FIGS. 4A to 4D and FIGS. 5A to 5D.

Figure 4A:
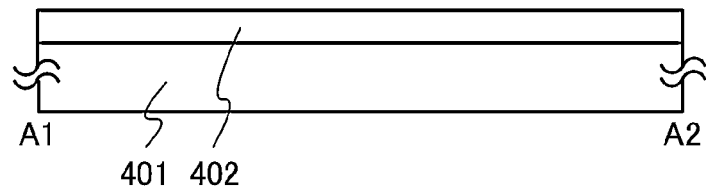
FIGS. 4A to 4D are cross-sectional views illustrating a method for manufacturing a semiconductor device.

First, the insulating film 402 is formed over the substrate 401 (see FIG. 4A).

Although there is no particular limitation on a substrate which can be used as the substrate 401 having an insulating surface, it is at least necessary that the substrate have heat resistance sufficient to withstand heat treatment performed later. For example, a variety of glass substrates used in the electronics industry, such as a barium borosilicate glass substrate or an aluminoborosilicate glass substrate can be used. Note that as the substrate 401, a substrate having a strain point of higher than or equal to 650° C. and lower than or equal to 750° C. (preferably higher than or equal to 700° C. and lower than or equal to 740° C.) is preferably used.

In the case where a large-sized glass substrate having the size of, for example, the fifth generation (1000 mm×1200 mm, or 1300 mm×1700 mm), the sixth generation (1700 mm×1800 mm), the seventh generation (1870 mm×2200 mm), the eighth generation (2200 mm×2700 mm), the ninth generation (2400 mm×2800 mm), the tenth generation (2880 mm×3130 mm), or the like is used, minute processing might become difficult owing to shrinkage of the substrate caused by heat treatment or the like in the process for manufacturing a semiconductor device. Therefore, when such a large-sized glass substrate is used as the substrate, the one with a small shrinkage is preferably used. For example, a large-sized glass substrate which has a shrinkage of 20 ppm or less, preferably 10 ppm or less, more preferably 5 ppm or less after heat treatment preferably at 450° C., more preferably 700° C. for one hour may be used as the substrate.

As the substrate 401, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Still alternatively, any of these substrates over which a semiconductor element is provided may be used.

The semiconductor device may be manufactured using a flexible substrate as the substrate 401. In order to manufacture a flexible semiconductor device, the transistor 440 including the stacked-layer oxide film 414 may be directly formed over a flexible substrate. Alternatively, the transistor 440 including the stacked-layer oxide film 414 may be formed over a formation substrate, and then, the transistor 440 may be separated and transferred to a flexible substrate. Note that in order to separate the transistor from the formation substrate and transfer it to the flexible substrate, a separation layer may be provided between the formation substrate and the transistor 440 including the stacked-layer oxide film 414.

The insulating film 402 can be formed by a plasma CVD method, a sputtering method, or the like. The gate insulating film 402 can be formed to have a single layer structure or a stacked structure, with the use of a silicon oxide film, a silicon oxynitride film, a silicon nitride oxide film, a silicon nitride film, a gallium oxide film, an aluminum oxide film, a silicon nitride film, an aluminum oxynitride film, and the like.

Note that in the insulating film 402, a region to be in contact with the oxide film 404a which is formed later is preferably an oxide insulating layer and preferably has a region (oxygen excess region) containing oxygen in excess of the stoichiometric composition. In order to provide the oxygen excess region in the insulating film 402, the insulating film 402 may be formed in an oxygen atmosphere, for example. Alternatively, the oxygen excess region may be formed by introduction of oxygen into the insulating film 402 after the film formation. Oxygen can be introduced by an ion implantation method, an ion doping method, a plasma immersion ion implantation method, plasma treatment, or the like.

When the oxygen excess region is provided in the insulating film 402, oxygen can be supplied to the stacked-layer oxide film 414 from the insulating film 402 by performing heat treatment after the stacked-layer oxide film 414 is formed. Accordingly, oxygen vacancies in the stacked-layer oxide film 414 can be filled, so that oxygen vacancies in the stacked-layer oxide film 414 can be reduced.

Figure 4B:
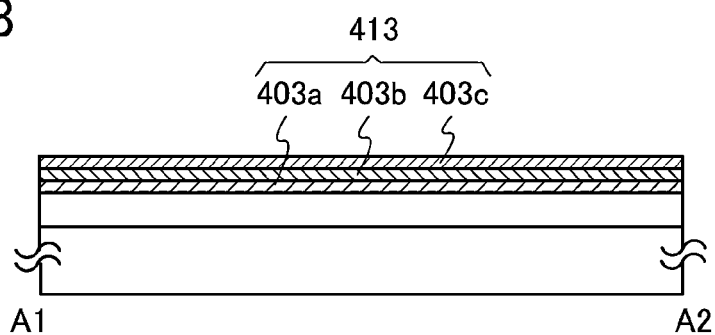

Next, the oxide film 403a, the oxide film 403b, and the oxide film 403c, which form the stacked-layer oxide film, are formed in this order over the insulating film 402 (see FIG. 4B).

With reference to FIG. 4B, the case is described in which the oxide film 403a is formed with a sputtering target which is an oxide having an atomic ratio of In:Ga:Zn=1:3:2, the oxide film 403b is formed with a sputtering target which is an oxide having an atomic ratio of In:Ga:Zn=1:1:1, and the oxide film 403c is formed with a sputtering target which is an oxide having an atomic ratio of In:Ga:Zn=1:3:2. The above embodiment can be referred to for the film formation conditions and the like for the oxide films 403a to 403c; thus, detailed description thereof is omitted here.

In the transistor 440, at least the oxide film 403b is a CAAC-OS film including crystal parts, and the oxide film 403a and the oxide film 403c do not necessarily include crystal parts. After the film formation, the oxide film 403c does not necessarily include crystal parts, and in this case, an amorphous oxide semiconductor film may be changed into the oxide film 403c including crystal parts by performing heat treatment in any step after the film formation. The heat treatment for crystallizing an amorphous oxide semiconductor film is performed at a temperature higher than or equal to 250° C. and lower than or equal to 700° C., preferably higher than or equal to 400° C., more preferably higher than or equal to 550° C. The heat treatment can also serve as another heat treatment in the manufacturing process. A laser irradiation apparatus may be used for the heat treatment for crystallization.

Note that it is preferable that the oxide films 403a to 403c be formed successively without being exposed to the air as described in the above embodiment. Successive formation of the oxide films without exposure to the air can prevent attachment of hydrogen or a hydrogen compound (e.g., adsorbed water) to surfaces of the oxide films and therefore can reduce the entry of impurities. Thus, the stacked-layer oxide film 413 can be formed to have a continuous junction (particularly, a U-shaped well structure where the energy at the bottom of the conduction band changes continuously between the films). In addition, it is preferable that the insulating film 402 to the stacked-layer oxide film 413 (the oxide film 403c) be formed successively without being exposed to the air.

Next, the oxide films 403a to 403c are preferably subjected to heat treatment for removal of excess hydrogen (including water and a hydroxyl group) contained in the films (this treatment is also referred to as dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. The heat treatment enables hydrogen, which is an impurity imparting n-type conductivity, to be removed.

Note that the heat treatment for dehydration or dehydrogenation may be performed at any timing in the process of manufacturing the transistor as long as the heat treatment is performed after the formation of the oxide films 403a to 403c. For example, the heat treatment may be performed after a stacked-layer oxide film 413 is processed into an island shape. The heat treatment for dehydration or dehydrogenation may be performed plural times, and may also serve as another heat treatment. A laser irradiation apparatus may be used for the heat treatment.

In the heat treatment, it is preferable that water, hydrogen, and the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, further preferably 7N (99.99999%) or more (i.e., the impurity concentration is 1 ppm or less, preferably 0.1 ppm or less).

In addition, after the stacked-layer oxide film 413 is heated by the heat treatment, a high-purity oxygen gas, a high-purity dinitrogen monoxide gas, or ultra-dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)) may be introduced into the same furnace while the heating temperature is maintained or slow cooling is performed to lower the temperature from the heating temperature. It is preferable that water, hydrogen, and the like be not contained in the oxygen gas or the dinitrogen monoxide gas. The purity of the oxygen gas or the dinitrogen monoxide gas that is introduced into the heat treatment apparatus is preferably greater than or equal to 6N, more preferably greater than or equal to 7N (i.e., the concentration of impurities in the oxygen gas or the dinitrogen monoxide gas is preferably less than or equal to 1 ppm, more preferably less than or equal to 0.1 ppm). The oxygen gas or the dinitrogen monoxide gas acts to supply oxygen that is a main component material of the stacked-layer oxide film and that is reduced by the step of removing an impurity for the dehydration or dehydrogenation, so that the stacked-layer oxide film can be a highly purified, i-type (intrinsic) stacked-layer oxide film.

Oxygen might be decreased by desorption at the same time as the dehydration or dehydrogenation treatment. Thus, oxygen (including at least one of an oxygen radical, an oxygen atom, and an oxygen ion) may be introduced into the stacked-layer oxide film after the dehydration or dehydrogenation treatment, in order to supply oxygen to the stacked-layer oxide film.

By introduction of oxygen into the stacked-layer oxide film for oxygen supply after the dehydration or dehydrogenation treatment, the stacked-layer oxide film can be highly purified and i-type (intrinsic). The change in the electric characteristics of a transistor including an i-type (intrinsic) stacked-layer oxide film is suppressed, and the transistor is electrically stable.

In the case where an oxygen introducing step is performed after the dehydration or dehydrogenation treatment, oxygen may be directly introduced into the oxide film or may be introduced through an insulating film which is formed later. The oxygen introducing step may be performed once or plural times after the formation of the oxide film 403a, after the formation of the oxide film 403b, and/or after the formation of the oxide film 403c. For example, the oxygen introducing step is performed after the deposition of the oxide film 403a, in which case the oxide film 403a becomes amorphous in some cases.

As a method for introducing oxygen (including at least one of an oxygen radical, an oxygen atom, and an oxygen ion), an ion implantation method, an ion doping method, a plasma immersion ion implantation method, plasma treatment, or the like can be used. A gas containing oxygen can be used for oxygen introducing treatment. As the gas containing oxygen, oxygen, dinitrogen monoxide, nitrogen dioxide, carbon dioxide, carbon monoxide, or the like can be used. Further, the gas containing oxygen for the oxygen introducing treatment may contain a rare gas.

For example, in the case where an oxygen ion is implanted by an ion implantation method, the dose may be greater than or equal to $1 \times 10^{13}$ ions/cm$^2$ and less than or equal to $5 \times 10^{16}$ ions/cm$^2$.

Through the oxygen introducing step, oxygen contained in the oxide films 403a to 403c can fill oxygen vacancies in the oxide films 403a to 403c by interdiffusing in the oxide films 403a to 403c. Accordingly, oxygen vacancies in the oxide films 403a to 403c can be reduced.

For example, in the case where an oxygen ion is implanted by an ion implantation method, the dose may be greater than or equal to $1 \times 10^{13}$ ions/cm$^2$ and less than or equal to $5 \times 10^{16}$ ions/cm$^2$.

Figure 4C:
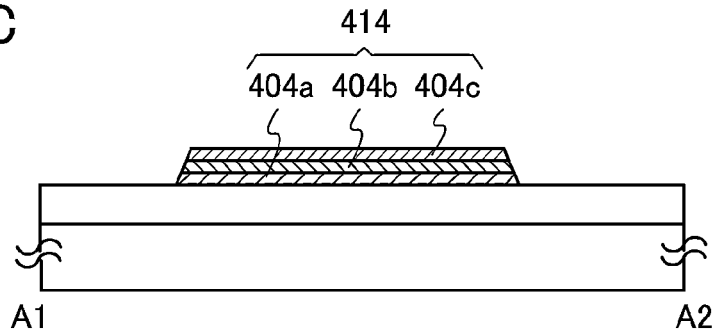

Next, the oxide films 403a to 403c are processed into the oxide films 404a to 404c having an island shape by etching treatment using a photolithography method, whereby the stacked-layer oxide film 414 is formed (see FIG. 4C).

Note that in this embodiment, the oxide films 403a to 403c having an island shape are obtained by performing etching treatment once, so that edge portions of the oxide films in the stacked-layer oxide film 414 are aligned with each other. Note that in this specification and the like, "aligned" includes "substantially aligned". For example, an edge portion of a layer A and an edge portion of a layer B, which are included in a stacked-layer structure and etched using the same mask, are considered to be aligned with each other.

Figure 4D:
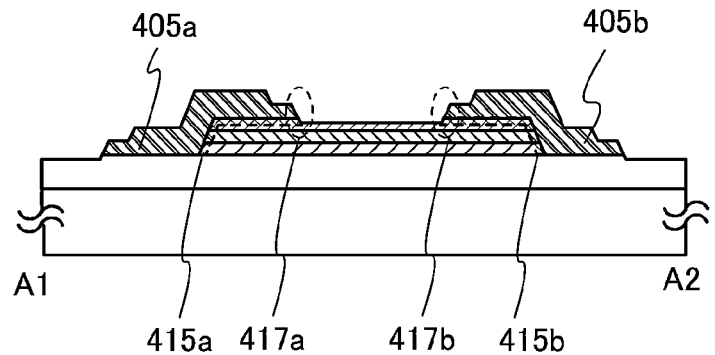

Next, a conductive film is formed over the stacked-layer oxide film 414 and processed into the conductive layer 405a and the conductive layer 405b (including a wiring formed using the same film) (see FIG. 4D).

For the conductive layer 405a and the conductive layer 405b, it is possible to use a metal film containing an element selected from aluminum, chromium, copper, tantalum, titanium, molybdenum, and tungsten, a metal nitride film containing any of these elements as its component (a titanium nitride film, a molybdenum nitride film, or a tungsten nitride film), or the like. Alternatively, a film of a high-melting-point metal such as titanium, molybdenum, or tungsten or a metal nitride film thereof (e.g., a titanium nitride film, a molybdenum nitride film, or a tungsten nitride film) may be formed over and/or under a metal film such as an aluminum film or a copper film. Further alternatively, the conductive film used for forming the conductive layer 405a and the conductive layer 405b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used. The thickness of each of the conductive layer 405a and the conductive layer 405b is greater than or equal to 50 nm and less than or equal to 600 nm.

The conductive layer 405a and the conductive layer 405b are formed by processing in the following manner.

First, the conductive film formed over the stacked-layer oxide film 414 is coated with a resist, and a photomask is set in a light-exposure apparatus, and then light is projected on the resist, so that the resist is exposed to light. Then, the resist is developed to form a resist mask.

In order to form a channel length L of the transistor 440 minutely, light with a wavelength less than or equal to 365 nm can be used as a light source of the light-exposure apparatus. For example, light having a spectrum of a high pressure mercury lamp such as the i-line (with a wavelength of 365 nm), or light with a wavelength in the range from an ultraviolet light region to a visible light region, such as KrF laser light (with a wavelength of 248 nm) or ArF laser light (with a wavelength of 193 nm), can be used.

After the formation of the resist mask, the conductive film is subjected to half etching (the etching is stopped such that the conductive film is left to cover the substrate) with use of the mask, whereby a conductive film having having a recessed portion is formed.

Next, the resist mask is reduced in size by, for example, ashing using oxygen plasma, and the conductive film having a recessed portion is partly exposed.

Next, the conductive film having a recessed portion is etched with the reduced resist mask, so that the conductive layer 405a and the conductive layer 405b are formed (see FIG. 4D). Furthermore, parts of the conductive film, which are not covered with the reduced resist mask, are etched, so that a projecting portion 417a and a projecting portion 417b are formed in the peripheries of the conductive layer 405a and the conductive layer 405b, respectively. Note that the projecting portion 417a of the conductive layer 405a has the same width and thickness as the projecting portion 417b of the conductive layer 405b.

The thickness of the projecting portion 417a of the conductive layer 405a is smaller than the thicknesses of the other regions in the conductive layer 405a; similarly, the thickness of the projecting portion 417b of the conductive layer 405b is smaller than the thicknesses of the other regions in the conductive layer 405b. That is, in each of the projecting portion 417a and the projecting portion 417b, the area of a cross section which is perpendicular to the direction in which electric charges flow is smaller.

In a general top-gate transistor, the gate insulating layer has steps (coverage) caused by the thickness of source and drain electrodes in regions where the gate insulating layer covers end portions of the source and drain electrodes, and the thickness of the gate insulating layer in the step portion is locally small as compared with that of the other region. Since withstand voltage is low in such a thin region, an electric field might concentrate on the region, whereby breakdown of a transistor may be caused. In addition, the thin region might cause gate leakage.

However, as illustrated in FIG. 4D, the projecting portion 417a and the projecting portion 417b with small thicknesses are formed in the peripheries of the conductive layer 405a and the conductive layer 405b to be a source electrode and a drain electrode, so that the thickness is decreased stepwise at the peripheries; thus, coverage with the gate insulating film to be formed later can be improved, and occurrence of disconnection and poor connection can be prevented. Further, with such a structure, formation of a region with a small thickness locally in the gate insulating film can be suppressed; thus, the withstand voltage of the transistor 440 can be increased and generation of gate leakage can be suppressed.

In the stacked-layer oxide film 414, the resistance of regions in contact with the conductive layer 405a and the conductive layer 405b might be decreased (the regions might have n-type conductivity). In FIG. 4D, regions in the stacked-layer oxide film 414 which are in contact with the conductive layer 405a and the conductive layer 405b are indicated by dotted lines. Such regions are called a low-resistance region 415a and a low-resistance region 415b. Each of the low-resistance region 415a and the low-resistance region 415b is formed in a region at 2 nm to 5 nm from a surface of the stacked-layer oxide film 414 in contact with the conductive layer 405a or the conductive layer 405b. When tungsten is used, for example, for the conductive layer 405a and the conductive layer 405b and heat treatment is performed in a state where the stacked-layer oxide film 414 is in contact with the conductive layer 405a and the conductive layer 405b, depending on materials of the conductive layer 405a and the conductive layer 405b, the conductive layer 405a and the conductive layer 405b remove oxide from part of the stacked-layer oxide film 414. In the stacked-layer oxide film 414, oxygen vacancies are formed in regions where oxygen is removed, and many carriers are generated. Furthermore, regions in the vicinity of the interfaces at which the stacked-layer oxide film 414 is in contact with the conductive layer 405a and the conductive layer 405b may include an element included in the conductive layer 405a and the conductive layer 405b, which also decreases the resistance of the regions in the vicinity of the interfaces.

The low-resistance region 415a and the low-resistance region 415b each serve as a source region or a drain region.

In the low-resistance region 415a and the low-resistance region 415b, the stacked-layer oxide film 414 is electrically connected to the conductive layer 405a and the conductive layer 405b to be a source electrode and a drain electrode, in which case contact resistance between the stacked-layer oxide film 414 and the source electrode and the drain electrode can be reduced. Moreover, an electric field applied to a channel formed between the low-resistance region 415a and the low-resistance region 415b can be relaxed.

Note that the low-resistance region 415a and the low-resistance region 415b can be formed in the oxide film 404b in the thickness direction of the stacked-layer oxide film 414, but preferably not formed in a channel formation region in the stacked-layer oxide film 414.

FIG. 4D shows the case where the insulating film 402 is partly removed when the conductive layer 405a and the conductive layer 405b are formed.

Figure 5A:
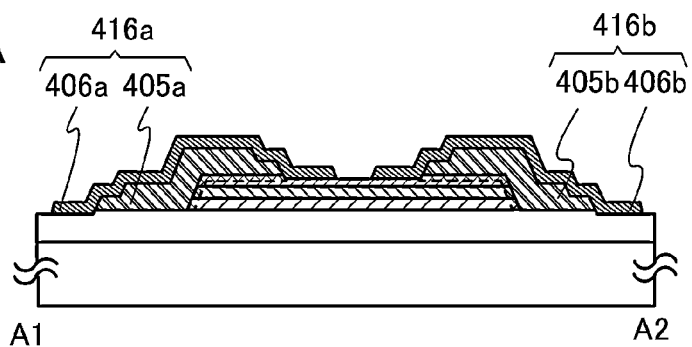
FIGS. 5A to 5D are cross-sectional views illustrating the method for manufacturing the semiconductor device.

Next, a conductive film is further formed over the stacked-layer oxide film 414, the conductive layer 405a, and the conductive layer 405b, and processed into the conductive layer 406a and the conductive layer 406b (including a wiring formed using the same film); thus, the source electrode 416a and the drain electrode 416b are formed (see FIG. 5A).

For the conductive layer 406a and the conductive layer 406b, as well as the conductive layer 405a and the conductive layer 405b, it is possible to use a metal film containing an element selected from aluminum, chromium, copper, tantalum, titanium, molybdenum, and tungsten, a metal nitride film containing any of these elements as its component (a titanium nitride film, a molybdenum nitride film, or a tungsten nitride film), or the like. Alternatively, a film of a high-melting-point metal such as titanium, molybdenum, or tungsten or a metal nitride film thereof (e.g., a titanium nitride film, a molybdenum nitride film, or a tungsten nitride film) may be formed over and/or under a metal film such as an aluminum film or a copper film. Further alternatively, the conductive film used for forming the conductive layer 405a and the conductive layer 405b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

As materials of the conductive layer 406a and the conductive layer 406b, it is preferable to use a material which does not form an oxide film at an interface with the stacked-layer oxide film 414 or the gate insulating film to be formed later. Examples of the material of the conductive layer 406a and the conductive layer 406b include titanium, titanium nitride, molybdenum nitride, tungsten nitride, and tantalum nitride. The thickness of each of the conductive layer 406a and the conductive layer 406b is greater than or equal to 1 nm and less than or equal to 50 nm, preferably greater than or equal to 1 nm and less than or equal to 30 nm, further preferably greater than or equal to 5 nm and less than or equal to 10 nm Note that the material of the conductive layer 405a may be the same as or different from the material of the conductive layer 406a; similarly, the material of the conductive layer 405b may be the same as or different from the material of the conductive layer 406b.

The distance between the conductive layer 406a and the conductive layer 406b corresponds to the distance between the source electrode 416a and the drain electrode 416b. That is, the distance between the source electrode 416a and the drain electrode 416b corresponds to the channel length L of the transistor. When the channel length L is less than 50 nm, a mask obtained by exposing a resist to an electron beam and then developing the resist is preferably used as an etching mask. The conductive film is etched using the etching mask, whereby the source electrode 416a and the drain electrode 416b can be formed. Precise exposure usuing an electron beam and development can provide a fine pattern; thus, the distance between the source electrode 416a and the drain electrode 416b, i.e., the channel length, can be less than 50 nm. For example, the channel length can be 20 nm or 30 nm. At a higher acceleration voltage, an electron beam can provide a finer pattern. Note that the mask obtained by exposing a resist to an electron beam and then developing the resist is not necessarily used for regions other than the region which determines the channel length L.

Figure 5B:
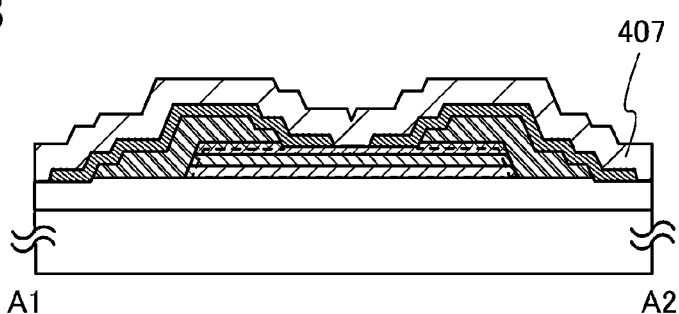

Next, the gate insulating film 407 is formed over the stacked-layer oxide film 414, the source electrode 416a, and the drain electrode 416b (see FIG. 5B).

The gate insulating film 407 can be formed by a plasma CVD method or a sputtering method.

The gate insulating film 407 can be formed to have a single layer structure or a stacked structure, with the use of one or more inorganic insulating films. Typical examples of the inorganic insulating films are a silicon oxide film, a silicon oxynitride film, an aluminum oxide film, an aluminum oxynitride film, a gallium oxide film, a hafnium oxide film, a magnesium oxide film, a zirconium oxide film, a lanthanum oxide film, a barium oxide film, a silicon nitride film, a silicon nitride oxide film, an aluminum nitride film, and an aluminum nitride oxide film.

In one embodiment of the present invention, the thickness of the gate insulating film 407 is at least larger than the thickness of the oxide film 404b. Thus, the thickness of the gate insulating film 407 is determined depending on the thickness of the oxide film 404b. The equivalent oxide thickness of the gate insulating film 407 is, for example, greater than or equal to 5 nm and less than or equal to 50 nm, preferably greater than or equal to 20 nm and less than or equal to 30 nm. The thickness may exceed 200 nm.

In this embodiment, a silicon oxide film is formed as the gate insulating film 407.

Here, in order to form an oxygen-excess region in the gate insulating film 407, the oxygen introducting step may be performed. The oxygen introducting step to the insulating film 407 can be performed in a manner similar to the oxygen introducting step to the insulating film 402.

Figure 5C:
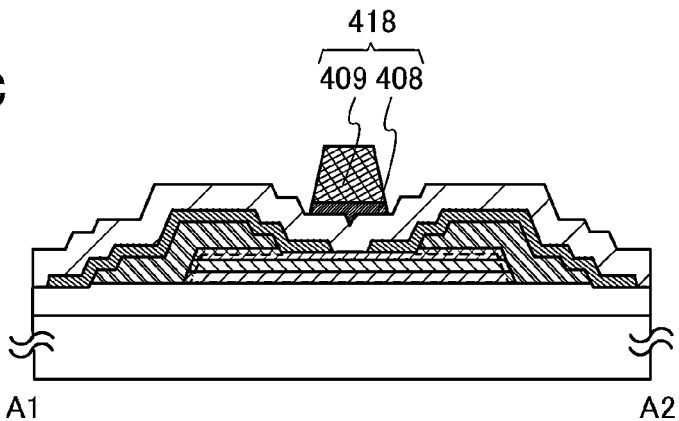

Next, two conductive films are formed over the gate insulating film 407, and processed into the conductive layer 408 and the conductive layer 409 (including wirings formed using the same films); thus, the gate electrode 418 is formed (see FIG. 5C).

For the conductive layer 408 and the conductive layer 409, it is possible to use a metal film containing an element selected from aluminum, chromium, copper, tantalum, titanium, molybdenum, and tungsten, a metal nitride film containing any of these elements as its component (a titanium nitride film, a molybdenum nitride film, or a tungsten nitride film), or the like. Alternatively, a film of a high-melting-point metal such as titanium, molybdenum, or tungsten or a metal nitride film thereof (e.g., a titanium nitride film, a molybdenum nitride film, or a tungsten nitride film) may be formed over and/or under a metal film such as an aluminum film or a copper film. Further alternatively, the conductive film used for forming the conductive layer 408 and the conductive layer 409 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

The conductive layer 408 is preferably formed with a material which does not form an oxide film at an interface with the gate insulating film 407. Examples of the material of the conductive layer 408 include titanium, titanium nitride, molybdenum nitride, tungsten nitride, and tantalum nitride. The thickness of the conductive layer 408 is greater than or equal to 1 nm and less than or equal to 50 nm. The thickness of the conductive layer 409 is greater than or equal to 50 nm and less than or equal to 600 nm.

For the processing for forming the gate electrode 418, a mask obtained by exposing a resist to an electron beam and then developing the resist is preferably used as an etching mask. Then, the two conductive films are etched using the etching mask, so that the gate electrode 418 having a short gate length can be formed. Note that the gate length is a length of the gate electrode in the direction in which carriers flow in the channel when the transistor 440 operates. With the use of the etching mask, the gate length of the gate electrode 418 can be 40 nm, for example. Precise exposure to an electron beam and precise development can provide a fine pattern; thus, Lov is greater than 0 and less than 20% of the channel length L, preferably greater than or equal to 5% and less than 10% of the channel length L. With such a structure, parasitic capacitance generated between the gate electrode 418 and the drain electrode 416b can be small.

Next, the insulating film 410 is formed over the gate insulating film 407 and the gate electrode 418. The insulating film 410 can be formed by a plasma CVD method or a sputtering method. The insulating film 410 is formed to have a single layer structure or a stacked structure, with the use of a silicon oxide film, a silicon oxynitride film, an aluminum oxide film, an aluminum oxynitride film, and the like. The insulating film 410 is preferably a film having a blocking effect which can prevent an impurity such as water from reaching the stacked-layer oxide film 414 from the outside of the transistor 440 or prevent excess oxygen contained in the gate insulating film 407 from diffusing outward. Examples of the film having the blocking effect include a silicon nitride film and an aluminum oxide film.

Through the above process, the transistor 440 can be manufactured.

When an oxide insulating film is used as an insulating film in contact with the stacked-layer oxide film 414 or an oxygen excess region is formed in the insulating film, excess oxygen contained in the insulating film can be supplied to the stacked-layer oxide film 414 by performing heat treatment or the like. In the manufacturing method described in this embodiment, oxygen-excess regions are formed in the insulating film 402 and the gate insulating film 407. Thus, oxygen can be supplied from the insulating film 402 and the gate insulating film 407 to the stacked-layer oxide film 414. A material that does not form an oxide film at an interface with the gate insulating film 407, such as tantalum nitride or titanium nitride, is used for the conductive layer 406a, the conductive layer 406b, and the conductive layer 408. With such a structure, the excess oxygen contained in the gate insulating film 407 can be supplied to the channel formation region in the stacked-layer oxide film 414 without reacting with the conductive layer 406a, the conductive layer 406b, and the conductive layer 408. Accordingly, oxygen vacancies in the stacked-layer oxide film 414 can be filled, so that oxygen vacancies in the stacked-layer oxide film 414 can be reduced.

Note that although the transistor including a stacked-layer oxide film formed by stacking three oxide films is described in this manufacturing method, a transistor including a single oxide film and a transistor including a stacked-layer oxide film formed by stacking two oxide films can be formed in a similar manner.

A transistor in which the CAAC-OS film described in the above embodiment is used as at least one oxide film (preferably the oxide film 404b) of the stacked-layer oxide film 414 has less change in electric characteristics due to irradiation with visible light or ultraviolet light. Therefore, the reliability of the transistor can be improved.

In the transistor, trap states resulting from impurities or defects can be formed in the vicinity of the interfaces between the oxide film 404a and an insulating film such as a silicon oxide film and between the oxide film 404c and an insulating film. However, since the oxide film 404a and the oxide film 404c are provided, the oxide film 404b in which a channel is formed can be distanced from the trap states.

In addition, since the oxide film 404a and the oxide film 404c contain one or more metal elements contained in the oxide film 404b, interface scattering is less likely to occur at the interfaces between the oxide film 404b and the oxide film 404a and between the oxide film 404b and the oxide film 404c. Accordingly, carrier transfer is not inhibited, and thus, the field-effect mobility of the transistor can be increased.

In the stacked-layer oxide film 414, hydrogen, nitrogen, carbon, silicon, and a metal element other than main components are impurities. In order to reduce the concentration of impurities in the stacked-layer oxide film 414, it is preferable to reduce the concentration of impurities in the gate insulating film 407 and the insulating film 402 which are adjacent to the stacked-layer oxide film 414. For example, silicon in the stacked-layer oxide film 414 forms an impurity state. In addition, the impurity state may serve as a trap, leading to deterioration of electric characteristics of the transistor in some cases.

Therefore, the concentration of hydrogen in each oxide film, which is measured by secondary ion mass spectrometry (SIMS), should be lower than or equal to $2 \times 10^{20}$ atoms/cm$^3$, preferably lower than or equal to $5 \times 10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in each oxide film, which is measured by SIMS, should be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in each oxide film, which is measured by SIMS, should be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of silicon in each oxide film, which is measured by SIMS, should be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The amount of each of the following gases released from each oxide film is $1\times10^{19}$/cm$^3$ or less, preferably $1\times10^{18}$/cm$^3$ or less, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

It is preferable that at least the oxide film 404b in the stacked-layer oxide film 414 where the channel of the transistor is formed be highly purified by reducing the concentration of impurities and by reducing oxygen vacancies in the oxide film 404b. The oxide film which is highly purified is i-type (intrinsic) semiconductor or substantially i-type semiconductor. The carrier density of an oxide film which is substantially i-type is lower than $1\times10^{17}$/cm$^3$, lower than $1\times10^{15}$/cm$^3$, or lower than $1\times10^{13}$/cm$^3$.

For example, the stacked-layer oxide film is formed as described in the above embodiment so that the film does not contain hydrogen, water, and the like, whereby the concentration of impurities contained in the stacked-layer oxide film can be reduced. Alternatively, the concentration of impurities may be reduced by performing heat treatment after the stacked-layer oxide film is formed, thereby removing hydrogen, water, and the like from the stacked-layer oxide film. After that, the stacked-layer oxide film can be highly purified by supplying oxygen to the stacked-layer oxide film to fill oxygen vacancies.

The off-state current of a transistor manufactured using the above oxide film for a channel formation region can be sufficiently reduced (here, the off-state current means a drain current when a potential difference between a source and a gate is equal to or lower than the threshold voltage in the off state, for example). With the use of a highly purified oxide film, the off-state current density of the transistor at 85° C. can be less than 1 zA/μn, preferably less than 1 yA/μm.

As described above, a transistor in one embodiment of the present invention has electrically stable characteristics. The use of the transistor in a semiconductor device makes it possible to improve reliability.

Figure 5D:
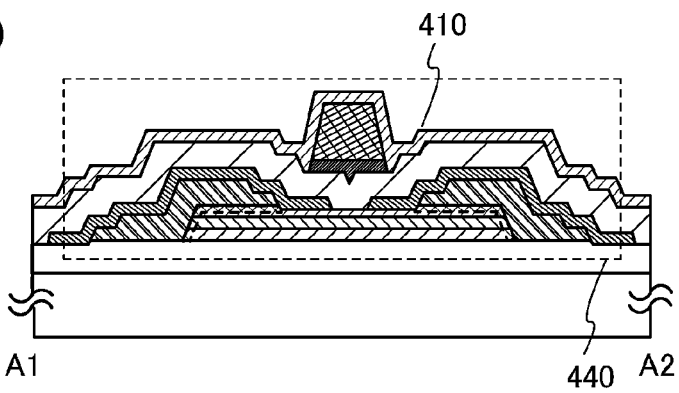
Figure 6:
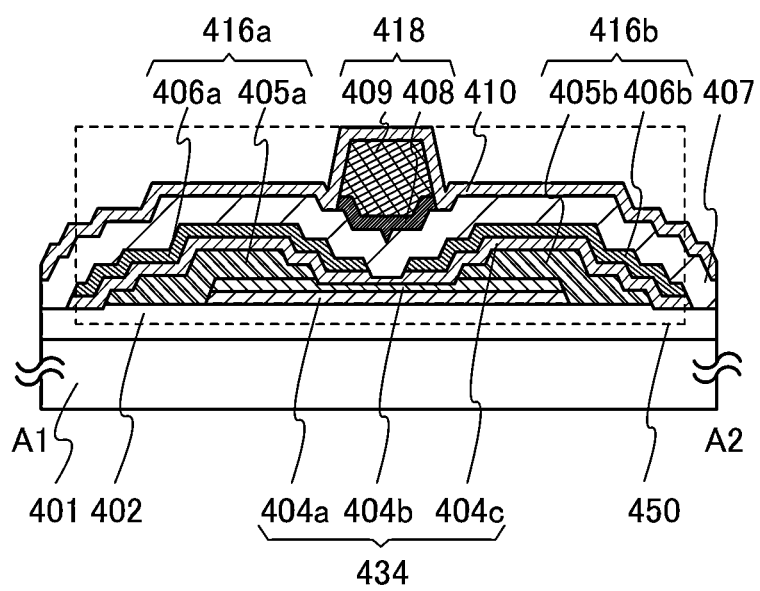
FIG. 6 is a cross-sectional view of one embodiment of a semiconductor device.

FIG. 6 illustrates a transistor 450 whose structure is partly different from the structure of the transistor 440 illustrated in FIG. 5D.

The difference between the transistor 450 illustrated in FIG. 6 and the transistor 440 illustrated in FIG. 5D is the structure of the stacked-layer oxide film. In the transistor 440 illustrated in FIG. 5D, three films (the oxide films 403a to 403c) are formed successively and processed into an island shape, thereby forming the stacked-layer oxide film 414.

In the transistor 450 illustrated in FIG. 6, two oxide films are formed successively and processed into an island shape. Then, a conductive film is formed over the two island-shaped films (the oxide films 404a and 404b) and processed into the conductive layer 405a and the conductive layer 405b. A third oxide film is formed to cover the two films (the oxide films 404a and 404b) and the conductive layers 405a and 406b, and a conductive film is further formed thereover. The third oxide film and the conductive film are processed, whereby the oxide film 404c, the conductive layer 406a, and the conductive layer 406b can be formed.

This embodiment can be implemented in appropriate combinations with any of the other embodiments.

Embodiment 4

In this embodiment, a semiconductor device including the transistor described in the above embodiment is described. Note that a semiconductor device in one embodiment of the present invention includes, in its category, various semiconductor integrated circuits formed using semiconductor elements, such as microprocessors, image processing circuits, controllers for display modules, digital signal processors (DSPs), microcontrollers, and the like. In addition, the semiconductor device in one embodiment of the present invention includes, in its category, various devices such as display modules and RF tags formed using the above semiconductor integrated circuits.

<Memory>

The transistor including an oxide film described in the above embodiment can have extremely low off-state current. That is, the transistor has electric characteristics in which leakage of charge through the transistor is less likely to occur. A memory which includes a transistor having such electric characteristics is described below with reference to FIGS. 7A and 7B, FIGS. 8A to 8C, and FIGS. 9A to 9C. The memory includes a memory element which is superior in function to a known memory element.

Figure 7A:
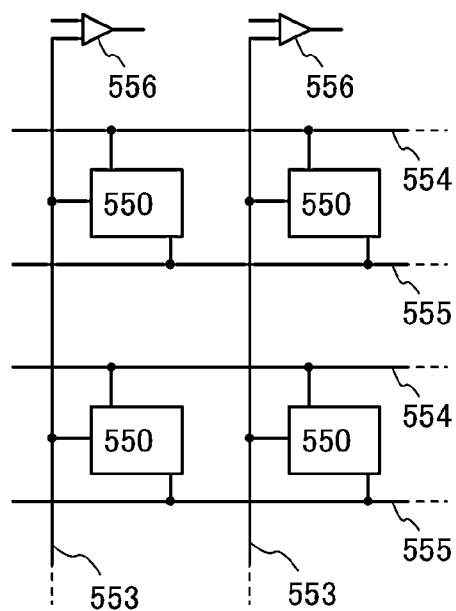
FIG. 7A is a circuit diagram of a memory cell array and FIG. 7B illustrates a memory.

FIG. 7A is a circuit diagram of a memory cell array.

The memory cell array in FIG. 7A includes a plurality of memory cells 550, a plurality of bit lines 553, a plurality of word lines 554, a plurality of capacitor lines 555, and a plurality of sense amplifiers 556.

Note that the bit lines 553 and the word lines 554 are provided in a grid pattern, and the memory cell 550 is provided for each intersection of the bit line 553 and the word line 554. The bit line 553 is connected to the sense amplifier 556, and the sense amplifier 556 has a function of reding a potential of the bit line 553 as data.

Figure 7B:
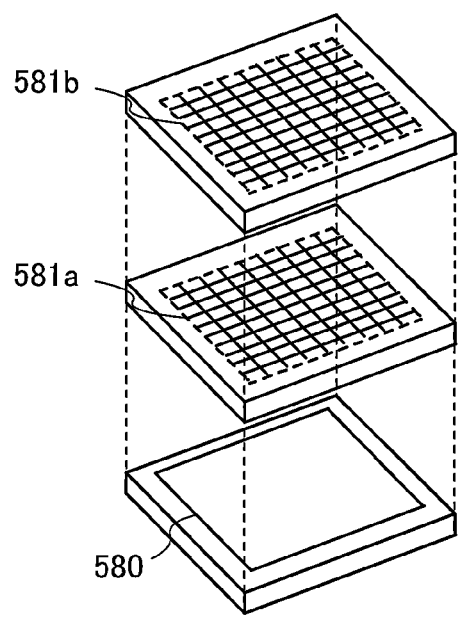

FIG. 7B illustrates a memory cell array 581a, a memory cell array 581b, and a peripheral circuit 580 which is needed for operating the memory cell arrays 581a and 581b. In a memory illustrated in FIG. 7B, the memory cell array 581a is provided over the peripheral circuit 580, and the memory cell array 581b is provided over the memory cell array 581a. The peripheral circuit 580 is electrically connected to each of the memory cell array 581a and the memory cell array 581b.

In the structure illustrated in FIG. 7B, the peripheral circuit 580 can be provided directly under the memory cell arrays 581a and 581b. Thus, the memory can be reduced in size.

A transistor provided in the peripheral circuit 580 is preferably formed with a semiconductor material which is different from materials of transistors provided in the memory cell arrays 581a and 581b. For example, silicon, germanium, silicon germanium, silicon carbide, or gallium arsenide can be used, and a single-crystal semiconductor is preferred. Alternatively, an organic semiconductor material or the like may be used. A transistor formed with such a semiconductor material can operate at sufficiently high speed. Therefore, a variety of circuits (e.g., a logic circuit or a driver circuit) which need to operate at high speed can be favorably achieved by the transistor. Note that the transistor described in the above embodiment can be used as the transistor provided in the memory cell array 581a.

The transistor described in the above embodiment is easily stacked over another transistor as compared to a transistor including silicon. Accordingly, the memory cell array 581a and the memory cell array 581b can be stacked over the peripheral circuit 580. Note that FIG. 7B illustrates, as an example, the structure in which two memory cell arrays (the memory cell arrays 581a and 581b) are stacked; however, the number of memory cell arrays to be stacked is not limited thereto. Three or more memory cell arrays may be stacked.

Next, a specific structure of the memory cell 550 illustrated in FIG. 7A is described with reference to FIGS. 8A to 8C.

Figure 8A:
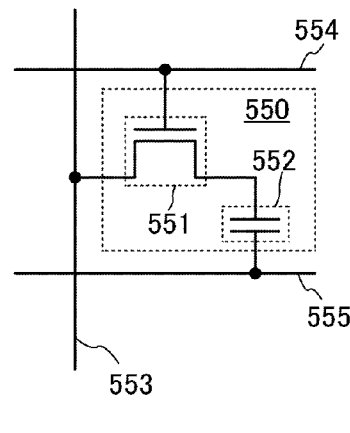
FIGS. 8A to 8C are a circuit diagram, a graph showing electric characteristics, and a cross-sectional view of a semiconductor device.

FIG. 8A is a circuit diagram of the memory cell 550 illustrated in FIG. 7A.

The memory cell 550 illustrated in FIG. 8A includes a transistor 551 and a capacitor 552. A gate of the transistor 551 is electrically connected to the word line 554. One of a source and a drain of the transistor 551 is electrically connected to the bit line 553. The other of the source and the drain is electrically connected to one electrode of the capacitor 552. The other electrode of the capacitor 552 is electrically connected to a capacitor line 555.

Figure 8B:
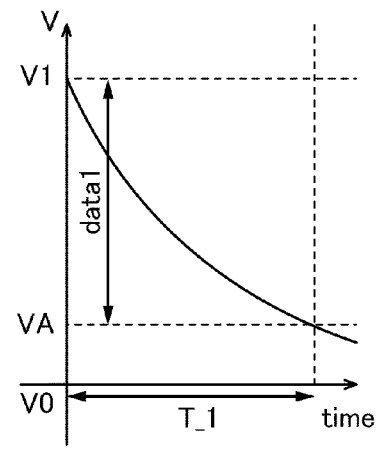
Figure 8C:
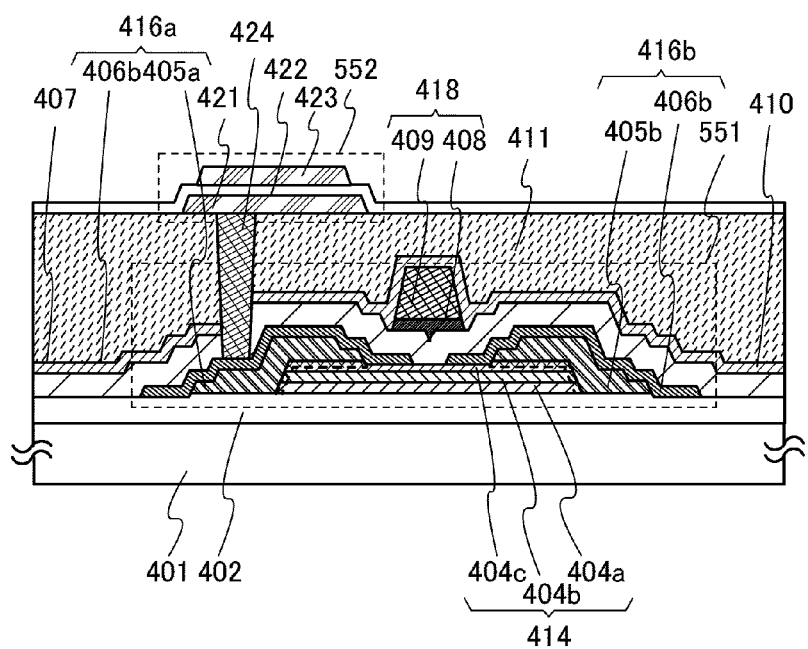

FIG. 8C illustrates an example of a cross-sectional structure of the memory cell 550. The memory cell 550 includes the capacitor 552 and the transistor 551 provided over the substrate 401 with the insulating film 402 formed therebetween.

An insulating film 411 is formed to have a single layer structure or a stacked structure, with the use of an inorganic insulating film such as an aluminum oxide film, a magnesium oxide film, a silicon oxide film, a silicon oxynitride film, a gallium oxide film, a germanium oxide film, an yttrium oxide film, a zirconium oxide film, a lanthanum oxide film, a neodymium oxide film, a hafnium oxide film, or a tantalum oxide film; or an organic insulating film such as a polyimide resin film, an acrylic resin film, an epoxy resin film, or a silicone resin.

A contact hole is formed in the gate insulating film 407, the insulating film 410, and the insulating film 411. In the contact hole, a contact plug 424 is provided. The source electrode 416a is connected to an electrode 421 through the contact plug 424.

The capacitor 552 includes the electrode 421, an insulating film 422 over the electrode 421, and an electrode 423 over the electrode 421 with the insulating film 422 provided therebetween.

Each of the electrodes 421 and 423 is formed to have a single layer structure or a stacked structure, with the use of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The insulating film 422 is formed to have a single layer structure or a stacked structure, with the use of an aluminum oxide, a magnesium oxide, a silicon oxide, a silicon oxynitride, a silicon nitride oxide, a silicon nitride, a gallium oxide, a germanium oxide, an yttrium oxide, a zirconium oxide, a lanthanum oxide, a neodymium oxide, a hafnium oxide, or a tantalum oxide.

Note that although FIG. 8B shows an example where the transistor 551 and the capacitor 552 are provided in different layers, one embodiment of the present invention is not limited to this structure. For example, the transistor 551 and the capacitor 552 may be provided in the same plane. With such a structure, memory cells having similar structures can be disposed so as to overlap with each other, in which case a large number of memory cells can be integrated in an area for one memory cell. Accordingly, the degree of integration of the memory can be improved.

As shown in FIG. 8C, a voltage retained in the capacitor 552 gradually decreases with time due to leakage through the transistor 551. A voltage originally charged from V0 to V1 is decreased with time to VA that is a limit for reading out data 1. This period is called a retention period T_1. In the case of a two-level memory cell, refresh operation needs to be performed within the retention period T_1.

For example, in the case where the off-state current of the transistor 551 is not sufficiently small, the retention period T_1 becomes short because the voltage retained in the capacitor 552 significantly changes with time. Accordingly, refresh operation needs to be frequently performed. An increase in frequency of refresh operation increases power consumption of the memory.

Since the off-state current of the transistor 551 is extremely small in this embodiment, the retention period T_1 can be made extremely long. In other words, the frequency of refresh operation can be reduced; thus, power consumption can be reduced. For example, in the case where the memory cell 550 is formed using the transistor 551 having an off-state current of $1\times10^{-21}$ A to $1\times10^{-25}$ A, data can be retained for several days to several decades without supply of electric power.

As described above, the memory of one embodiment of the present invention has high degree of integration and low power consumption.

Next, a memory which differs from the memory illustrated in FIGS. 8A to 8C is described with reference to FIGS. 9A to 9C.

Figure 9A:
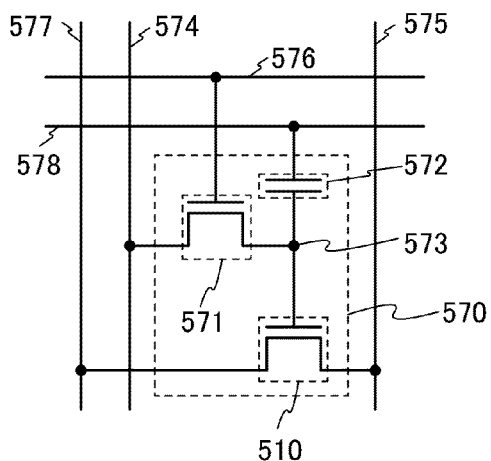
FIGS. 9A to 9C are a circuit diagram, a graph showing electric characteristics, and a cross-sectional view of a semiconductor device.

FIG. 9A is a circuit diagram including a memory cell 570 and a wiring.

A memory cell in FIG. 9A includes a transistor 510, a transistor 571, and a capacitor 572. A gate of the transistor 571 is electrically connected to a word line 576. One of a source and a drain of the transistor 571 is electrically connected to a source line 575. The other of the source and the drain of the transistor 571 is electrically connected to a gate of the transistor 510 and one electrode of the capacitor 572, and the connection portion is called a node 573. One of a source and a drain of the transistor 510 is electrically connected to a signal line 574. The other of the source and the drain of the transistor 510 is electrically connected to a bit line 577. The other electrode of the capacitor 572 is electrically connected to a capacitor line 578.

Figure 9B:
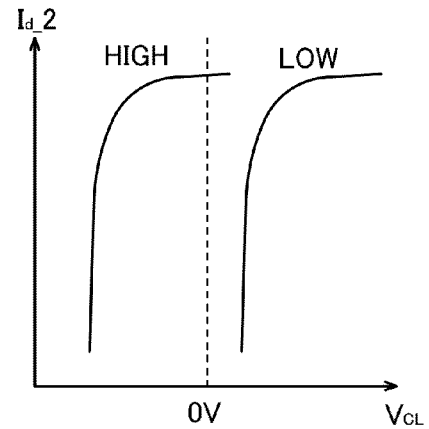
Figure 9C:
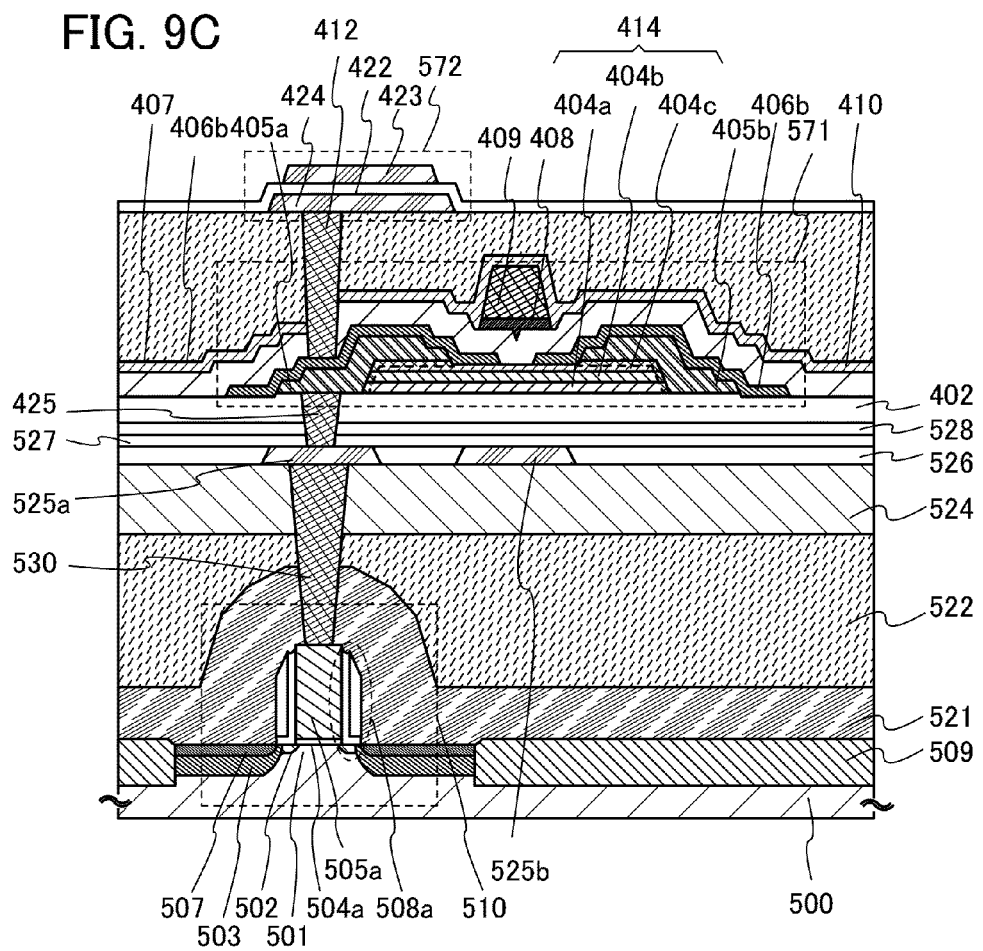

The memory cell illustrated in FIGS. 9A to 9C utilizes a change in apparent threshold voltage of the transistor 510, which depends on the potential of the node 573. FIG. 9B is a graph showing relations between voltage $V_{CL}$ of the capacitor line 578 and drain current $I_d\_2$ flowing through the transistor 510.

In the memory cell illustrated in FIGS. 9A to 9C, the potential of the node 573 can be controlled through the transistor 571. For example, the potential of the source line 575 is set to a power supply potential (VDD). In this case, when the potential of the word line 576 is set to be higher than or equal to the sum of the power supply potential (VDD) and the threshold voltage Vth of the transistor 571, the potential of the node 573 can be HIGH. Furthermore, when the potential of the word line 576 is set to be lower than or equal to the threshold voltage Vth of the transistor 571, the potential of the node 573 can be LOW.

Thus, the transistor 510 has electric characteristics shown with either a $V_{CL}$-$I_{d\_2}$ curve denoted as LOW or a $V_{CL}$-$I_{d\_2}$ curve denoted as HIGH. That is, when the potential of the node 573 is LOW, $I_{d\_2}$ is small at a $V_{CL}$ of 0 V; accordingly, data 0 is stored. Further, when the potential of the node 573 is HIGH, $I_{d\_2}$ is large at a $V_{CL}$ of 0 V; accordingly, data 1 is stored. In this manner, data can be stored.

FIG. 9C illustrates an example of a cross-sectional structure of the memory cell. The memory cell 570 includes the transistor 510 provided over a silicon wafer, and the transistor 571 and the capacitor 572 which are provided over the transistor 510.

First, the transistor 510 located in the lower portion is described. Note that the case where the transistor 510 is an n-channel transistor is described here, but the transistor 510 may be a p-channel transistor.

An n-channel transistor 510 includes a channel formation region 501 provided in a substrate 500 including a semiconductor material, low-concentration impurity regions 502 and high-concentration impurity regions 503 (collectively simply referred to as impurity regions in some cases) with the channel formation region 501 provided between the impurity regions, intermetallic compound regions 507 provided in contact with the impurity regions, a gate insulating layer 504a provided over the channel formation region 501, and a gate electrode layer 505a provided over the gate insulating layer 504a. Sidewall insulating layers 508a are provided on side surfaces of the gate electrode layer 505a. An insulating layer 521 and an insulating layer 522 are provided to cover the transistor 510. Note that in FIG. 9C, the source electrode and the drain electrode are not illustrated.

An impurity imparting n-type conductivity is added to the low-concentration impurity regions 502 and the high-concentration impurity regions 503. As the impurity element which imparts n-type conductivity, phosphorus, arsenic, or the like can be used.

Element separation insulating films 509 are provided for the substrate 500 to surround the transistor 510.

The substrate 500 can be a single crystal semiconductor substrate or a polycrystalline semiconductor substrate made of silicon, silicon carbide, or the like or a compound semiconductor substrate such as a GaAs substrate, an InP substrate, a GaN substrate, a SiC substrate, a GaP substrate, a GaInAsP substrate, or a ZnSe substrate.

Although the case where the channel of the transistor 510 is formed in the semiconductor substrate is illustrated in FIG. 6, the channel of the transistors 510 may be formed in a semiconductor film formed over an insulating surface.

The semiconductor film is formed using amorphous silicon, polycrystalline silicon, single crystal silicon, or the like. Amorphous silicon is formed by a CVD method, a sputtering method, or the like. Polycrystalline silicon is formed by crystallizing amorphous silicon with a laser beam. Single crystal silicon is formed in such a manner that hydrogen ions are implanted into a single crystal silicon substrate and then a surface portion of the single crystal silicon substrate is separated.

The transistor including crystalline silicon has an advantage over the transistor including an oxide film in that on-state characteristics can be easily improved. Therefore, the transistor including crystalline silicon is suitably used as the transistor 571 for which excellent on-state characteristics are required.

The sidewall insulating layers 508a are provided on the side surfaces of the gate electrode layer 505a formed over the gate insulating layer 504a. The low-concentration impurity regions 502 and the high-concentration impurity regions 503 which have different impurity concentrations can be formed in a self-aligned manner by using the gate electrode layer 505a and the sidewall insulating layers 508a as masks when an n-type impurity is added to the substrate 500.

The gate insulating layer 504a is formed using silicon oxide, silicon oxynitride, silicon nitride, silicon nitride oxide, or the like by a CVD method, a sputtering method, a thermal oxidation method, or the like.

The gate electrode layer 505a is formed using a metal material such as molybdenum, titanium, tantalum, tungsten, aluminum, copper, chromium, neodymium, or scandium or an alloy material containing any of these materials as a main component by a sputtering method or a CVD method.

A sidewall insulating layer 508a is formed using silicon oxide, silicon oxynitride, silicon nitride, silicon nitride oxide, or the like by a CVD method or a sputtering method. FIG. 9C shows the sidewall insulating layer 508a having a stacked structure.

The insulating layers 521 and 522 are each formed using silicon oxide, silicon oxynitride, silicon nitride oxide, or the like by a CVD method, a sputtering method, or the like. Alternatively, the insulating layers 521 and 522 may be formed using silicon oxide formed by a low temperature oxidation (LTO) method. Further alternatively, silicon oxide with favorable step coverage, which is formed by reacting tetraethyl ortho-silicate (TEOS), silane, or the like with oxygen, nitrous oxide, or the like can be used. Note that the insulating layer 522 is preferably subjected to polishing treatment (e.g., a chemical mechanical polishing (CMP) method), dry etching treatment, or plasma treatment so as to increase the planarity of the surface of the insulating layer 522.

FIG. 9C illustrates the structure in which an insulating layer 524 is provided over the insulating layer 522. The insulating layer 524 is formed with the use of, for example, a silicon oxide, a silicon nitride, a silicon nitride oxide, a silicon oxynitride, or an aluminum oxide by a CVD method, a sputtering method, or the like. Note that polishing treatment or the like may be performed also on the insulating layer 524 in order to improve its surface flatness.

A contact hole is formed in the insulating layer 521, the insulating layer 522, and the insulating layer 524. A contact plug 530 is provided in the contact hole. An electrode 525a and an electrode 525b are provided over the insulating layer 524. The gate electrode layer 505a is connected to the electrode 525a through the contact plug 530.

Each of the electrodes 525a and 525b is formed to have a single layer structure or a stacked structure, with the use of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

An insulating layer 526 is formed in contact with the electrode 525a and the electrode 525b. The insulating layer 526 is formed with the use of, for example, a silicon oxide, a silicon nitride oxide, or a silicon oxynitride by a CVD method, a sputtering method, or the like. The insulating layer 526 is formed in the following manner: an insulating layer is formed over the insulating layer 524, the electrode 525a, and the electrode 525b, and is subjected to polishing treatment until surfaces of the electrode 525a and the electrode 525b are exposed.

An insulating layer 527 and an insulating layer 528 are formed over the electrode 525a, the electrode 525b, and the insulating layer 526. The method and the material for forming the insulating layer 524 are used for the formation of the insulating layer 527 and the insulating layer 528. It is preferable that at least one of the insulating layer 527 and the insulating layer 528 be a film (also referred to as a blocking film) which prevents hydrogen contained in the insulating layer 522 and the insulating layer 521 from passing through the insulating layer 527 or the insulating layer 528. When at least one of the insulating layer 527 and the insulating layer 528 is used as the blocking film, hydrogen can be prevented from entering the transistor 571 including the stacked-layer oxide film 414.

The transistor 571 located in the upper portion is provided over the insulating layer 528 with the insulating film 402 placed therebetween. A contact hole is formed in the insulating layer 527, the insulating layer 528, and the insulating film 402. A contact plug 425 is provided in the contact hole. The electrode 525a is connected to the conductive layer 405a included in the transistor 571 through the contact plug 425. The gate of the transistor 510 located in the lower portion can be connected to a drain of the transistor 571 located in the upper portion through the contact plug 425.

The transistor 571 illustrated in FIG. 9C has a structure partly different from the structure of the transistor 551 illustrated in FIG. 8C. The transistor 571 illustrated in FIG. 9C has a back gate. In FIG. 9C, the electrode 525b serves as the back gate of the transistor 571.

For example, in the transistor 571, the gate electrode 418 may be supplied with a signal for controlling whether to turn on or off the transistor, and the electrode 525b may be supplied with a fixed potential (e.g., a ground potential or a negative potential). By controlling the level of the potential supplied to the electrode 525b, the threshold voltage of the transistor 571 can be controlled. By controlling the potentials of both gate electrodes as described above, a change in threshold voltage of the transistor 571 can be reduced. Thus, the transistor 571 can be prevented from becoming normally on.

The description of FIG. 8C and the above embodiment can be referred to for the other structures of the transistor 571 and the structure of the capacitor 572; thus, detailed description thereof is omitted here.

Note that although FIG. 9C shows an example where the transistor 571 and the capacitor 572 are provided in different layers, one embodiment of the present invention is not limited to this structure. For example, the transistor 571 and the capacitor 572 may be provided in the same plane. With such a structure, memory cells having similar structures can be disposed so as to overlap with each other, in which case a large number of memory cells can be integrated in an area for one memory cell. Accordingly, the degree of integration of the semiconductor device can be improved.

Here, when any of the transistors including the stacked-layer oxide film 414 described in the above embodiment is used as the transistor 571, charge accumulated in the node 573 can be prevented from leaking through the transistor 571 because the off-state current of the transistor is extremely small. Therefore, data can be retained for a long period. Further, a voltage necessary for writing data does not need to be high as compared to the case of a flash memory; thus, power consumption can be made lower and operation speed can be made higher.

As described above, according to one embodiment of the present invention, a memory with high degree of integration and low power consumption can be provided.

Note that the above memory may be provided as one function in another LSI, e.g., an arithmetic processing unit such as a CPU.

As described above, according to one embodiment of the present invention, a memory with high degree of integration and low power consumption can be provided.

Note that the above memory may be provided as one function in another LSI, e.g., an arithmetic processing unit such as a CPU.

<CPU>

A central processing unit (CPU) can be formed with the use of the transistor including the oxide film described in the above embodiment or the memory element described in the above embodiment for at least part of the CPU.

Figure 10A:
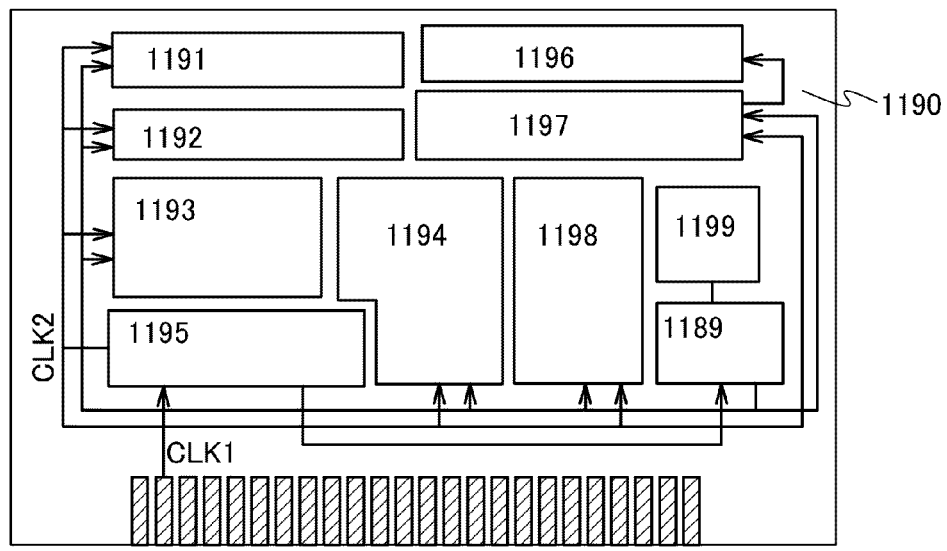
FIGS. 10A to 10C are block diagrams illustrating a structure of a CPU.

FIG. 10A is a block diagram illustrating a specific configuration of a CPU. The CPU illustrated in FIG. 10A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided on a separate chip. Obviously, the CPU illustrated in FIG. 10A is just an example in which the configuration is simplified, and actual CPUs may have various configurations depending on the application.

An instruction input to the CPU through the bus interface 1198 is input to the instruction decoder 1193, decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls based on the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads and writes data from and to the register 1196 depending on the state of the CPU.

The timing controller 1195 generates signals for controlling timing of operation of the ALU 1191, the ALU controller 1192, the instruction decoder 1193, the interrupt controller 1194, and the register controller 1197. For example, the timing controller 1195 is provided with an internal clock generator for generating an internal clock signal CLK2 based on a reference clock signal CLK1, and supplies the clock signal CLK2 to the above-mentioned various circuits.

In the CPU illustrated in FIG. 10A, a memory element is provided in the register 1196. The memory element described in the above embodiment can be used in the register 1196.

In the CPU illustrated in FIG. 10A, the register controller 1197 selects operation of retaining data in the register 1196 in accordance with an instruction from the ALU 1191. That is, data is retained by a flip-flop or by a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 10B:
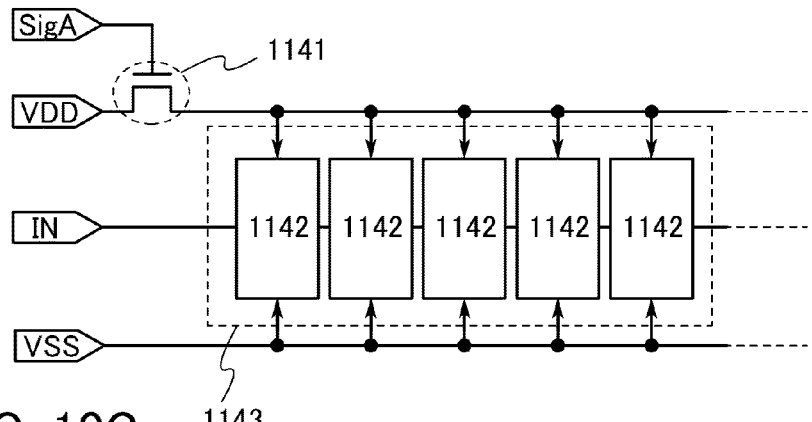
Figure 10C:
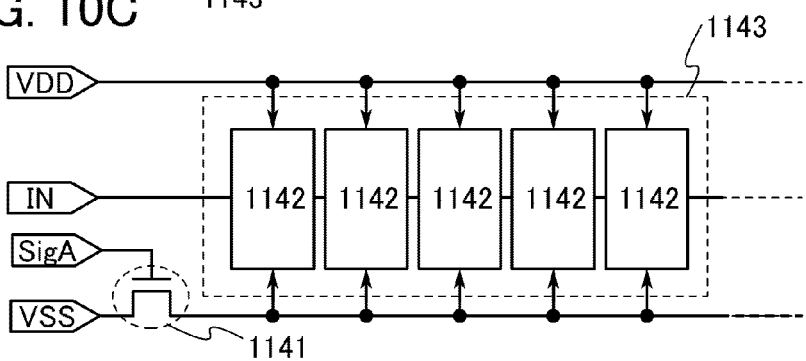

The power supply can be stopped by a switching element provided between a memory element group and a node to which a power supply potential (VDD) or a power supply potential (VSS) is supplied, as illustrated in FIG. 10B or FIG. 10C. Circuits illustrated in FIGS. 10B and 10C are described below.

FIGS. 10B and 10C each illustrate an example of a configuration using the transistor including the oxide film described in the above embodiment as a switching element for controlling supply of a power supply potential to a memory element.

The memory device illustrated in FIG. 10B includes a switching element 1141 and a memory element group 1143 including a plurality of memory elements 1142. Specifically, as each of the memory elements 1142, the memory element described in the above embodiment can be used. Each of the memory elements 1142 included in the memory element group 1143 is supplied with a high-level power supply potential (VDD) through the switching element 1141. Further, each of the memory elements 1142 included in the memory element group 1143 is supplied with a potential of a signal IN and a low-level power supply potential (VSS).

As the switching element 1141 in FIG. 10B, the transistor including the oxide film described in the above embodiment is used. The transistor has significantly low off-state current. The switching of the transistor is controlled by a signal SigA supplied to a gate thereof.

Note that FIG. 10B illustrates a configuration in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

FIG. 10C illustrates an example of a memory device in which each of the memory elements 1142 included in the memory element group 1143 is supplied with the low-level power supply potential (VSS) through the switching element 1141. The supply of the low-level power supply potential (VSS) to each of the memory elements 1142 included in the memory element group 1143 can be controlled by the switching element 1141.

When a switching element is provided between a memory element group and a node to which the power supply potential (VDD) or the power supply potential (VSS) is supplied, data can be retained even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that power consumption can be reduced.

Although the CPU is given as an example, the transistor or the memory element can also be applied to an LSI, e.g., a digital signal processor (DSP), a graphics processing unit (GPU), a custom LSI, or a programmable logic device (PLD) such as a field programmable gate array (FPGA) or a field programmable analog array (FPAA).

<Microcomputer>

In this embodiment, a configuration and operation of one example of a microcomputer which performs arithmetic processing on a signal detected by a sensor and outputs the result of the arithmetic processing are described with reference to FIG. 11, FIGS. 12A to 12C, FIG. 13, and FIG. 14.

Figure 11:
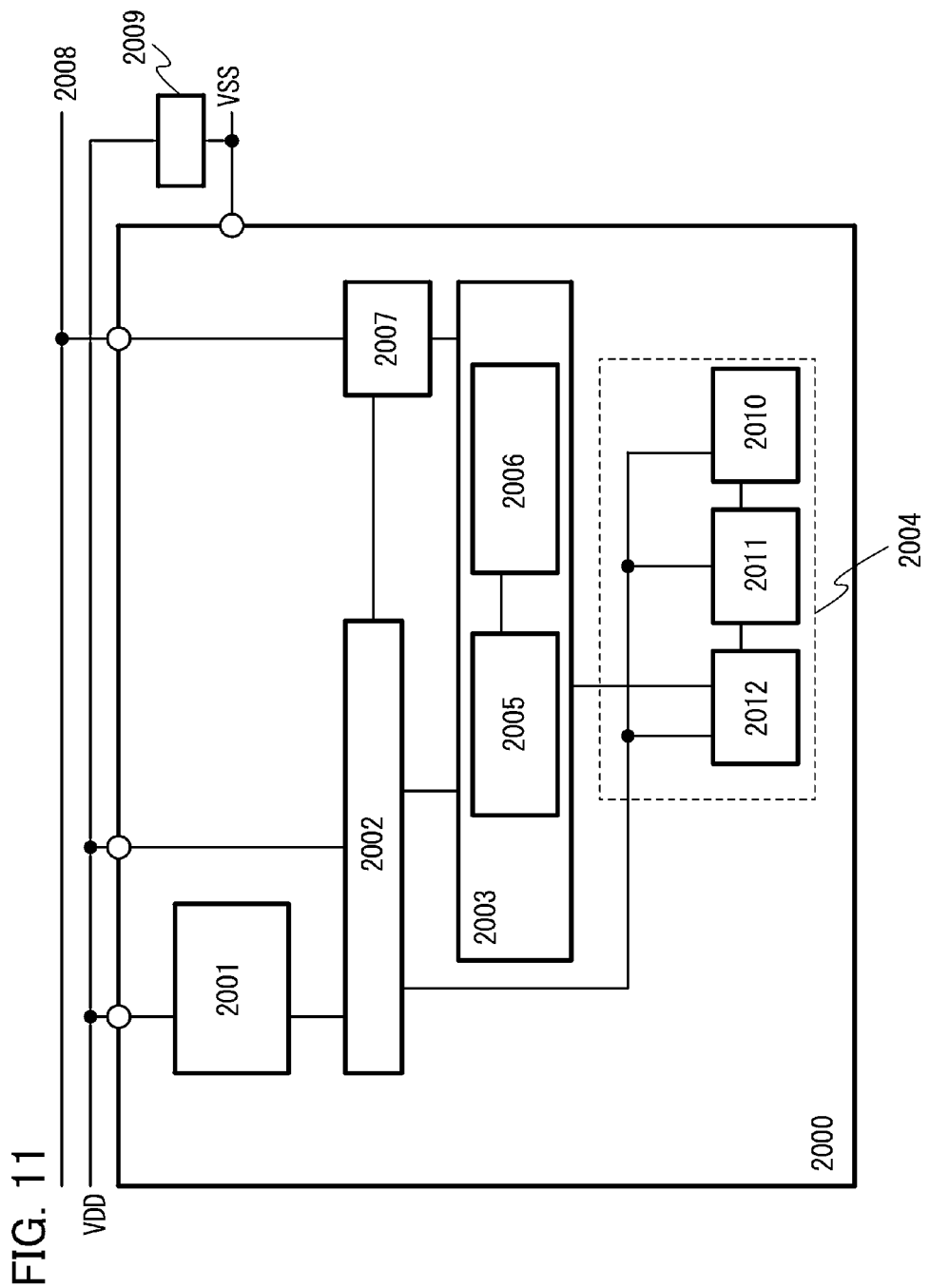
FIG. 11 is a block diagram illustrating a structure of a micro computer.

FIG. 11 is a block diagram of a configuration of a microcomputer in one embodiment of the disclosed invention.

A microcomputer 2000 includes a power gate controller 2001 electrically connected to a high-potential power supply line (VDD), a power gate 2002 electrically connected to the high-potential power supply line (VDD) and the power gate controller 2001, a CPU 2003 electrically connected to the power gate 2002, and a sensing portion 2004 electrically connected to the power gate 2002 and the CPU 2003. The CPU 2003 includes a volatile memory portion 2005 and a nonvolatile memory portion 2006.

The CPU 2003 is electrically connected to a bus line 2008 through an interface 2007. Like the CPU 2003, the interface 2007 is also electrically connected to the power gate 2002. As a bus standard for the interface 2007, I$^2$C bus or the like can be used, for example, The power gate controller 2001 includes a timer and controls the power gate 2002 using the timer. In accordance with control by the power gate controller 2001, the power gate 2002 supplies power or stop power supply to the CPU 2003, the sensing portion 2004, and the interface 2007 from the high-potential power supply line (VDD). As the power gate 2002 here, a switching element such as a transistor can be used, for example.

The use of the power gate controller 2001 and the power gate 2002 described above makes it possible to supply power to the sensing portion 2004, the CPU 2003, and the interface 2007 in periods of sensing by a sensor and stop the power supply to the sensing portion 2004, the CPU 2003, and the interface 2007 in periods between the above periods. Such operation of the microcomputer can reduce power consumption as compared to the case where power is constantly supplied to each of the above components.

In the case where a transistor is used as the power gate 2002, it is preferable to use a transistor including an oxide film and having significantly low off-state current, which is also used in the nonvolatile memory portion 2006. By using such a transistor, leakage current during a period in which power supply is stopped by the power gate 2002 can be reduced, and power consumption can be reduced.

In the microcomputer 2000 described in this embodiment, a direct-current power source 2009 may be provided and power may be supplied from the direct-current power source 2009 to the high-potential power supply line (VDD). A high-potential-side electrode of the direct-current power source 2009 is electrically connected to the high-potential power supply line (VDD), and a low-potential-side electrode of the direct-current power source 2009 is electrically connected to a low-potential power supply line (VSS). The low-potential power supply line (VSS) is electrically connected to the microcomputer 2000. Here, the high-potential power supply line (VDD) is supplied with a high potential H. The low-potential power supply line (VSS) is supplied with a low potential L such as a ground potential (GND).

Note that the direct-current power source 2009 is not necessarily provided in the microcomputer of this embodiment; for example, power may be supplied through a wiring from an alternate-current power source which is provided outside the microcomputer.

As the power source, a secondary battery such as a lithium ion secondary battery or a lithium ion polymer secondary battery can also be used, for example. In addition, a solar cell may be provided so that the secondary battery can be charged. As the solar cell, it is possible to use any of the following: a silicon-based solar cell including a single layer or a stacked layer of single crystal silicon, polycrystalline silicon, microcrystalline silicon, or amorphous silicon; an InGaAs-based, GaAs-based, CIS-based, Cu$_2$ZnSnS$_4$-based, or CdTe—CdS-based solar cell; a dye-sensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

The sensing portion 2004 measures physical quantities and transmits the measurements to the CPU 2003.

The sensing portion 2004 includes a sensor 2010 electrically connected to the power gate 2002, an amplifier 2011 electrically connected to the power gate 2002, and an AD converter 2012 electrically connected to the power gate 2002 and the CPU 2003. The sensor 2010, the amplifier 2011, and the AD converter 2012 provided in the sensing portion 2004 operate when the power gate 2002 supplies power to the sensing portion 2004.

As the sensor 2010 here, any of a variety of sensors to which mechanical, electromagnetic, thermal, acoustic, and chemical means are applied can be used depending on the intended use of the microcomputer. Examples include a variety of sensors having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays.

Here, it is described how the microcomputer 2000 detects a signal.

When a target physical quantity appears, disappears, or changes, a signal based on the physical quantity is input to the sensor 2010 provided in the microcomputer 2000. After the signal is input to the sensor 2010, a potential based on the input signal is input to the amplifier 2011, a potential amplified by the amplifier 2011 is input to the AD converter 2012, and a potential converted from an analog signal into a digital signal by the AD converter 2012 is transmitted to the CPU 2003. In this manner, the microcomputer including the sensor 2010 detects the appearance, disappearance, or change of a physical quantity.

By using the microcomputer 2000 including the sensing portion 2004 described above, an alarm device such as a fire alarm, a gas alarm, a burglar alarm, or a security alarm can be manufactured.

The CPU 2003 performs arithmetic processing on a measurement and transmits a signal based on the result of the arithmetic processing. The signal transmitted from the CPU 2003 is output to the bus line 2008 through the interface 2007.

Furthermore, the signal is not necessarily transmitted via a wire, and may be transmitted wirelessly. For example, in addition to the microcomputer 2000 of this embodiment, a wireless chip may be provided in an electronic device.

The CPU 2003 includes the volatile memory portion 2005 and the nonvolatile memory portion 2006. Before the power gate 2002 stops power supply, data of the volatile memory portion 2005 is stored in the nonvolatile memory portion 2006, and when the power gate 2002 starts power supply, the data in the nonvolatile memory portion 2006 is restored to the volatile memory portion 2005.

The volatile memory portion 2005 includes a plurality of volatile memory elements, a circuit for controlling the plurality of volatile memory elements, and the like. Note that the volatile memory elements included in the volatile memory portion 2005 have a higher access speed than at least nonvolatile memory elements included in the nonvolatile memory portion 2006.

There is no particular limitation on the semiconductor material used for transistors included in the volatile memory elements, but it is preferable to use a material having a band gap which differs from that of a semiconductor material used for transistors having low off-state current and included in the nonvolatile memory elements. As such a semiconductor material, for example, silicon, germanium, silicon germanium, gallium arsenide, or the like can be used, and a single crystal semiconductor is preferably used. In terms of increasing the speed of data processing, it is preferable to use a transistor with high switching speed such as a transistor formed using single crystal silicon, for example.

The nonvolatile memory portion 2006 includes a plurality of nonvolatile memory elements, a circuit for controlling the plurality of nonvolatile memory elements, and the like. The nonvolatile memory elements are electrically connected to nodes where charges corresponding to data of the volatile memory elements are retained, and are used to store the data of the volatile memory elements in a period where power supply is stopped. Thus, the nonvolatile memory elements included in the nonvolatile memory portion 2006 retain data for a longer period than the volatile memory elements at least when power is not supplied.

Here, examples of configurations of the nonvolatile memory elements provided in the nonvolatile memory portion 2006 are described with reference to FIGS. 12A to 12C.

Figure 12A:
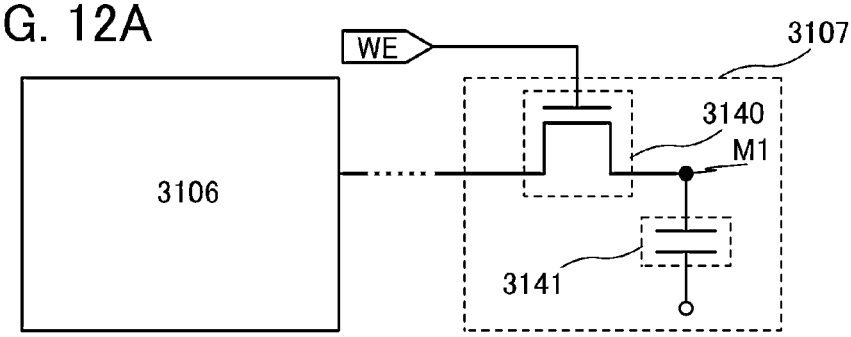
FIGS. 12A to 12C illustrate structures of nonvolatile memory elements.

A nonvolatile memory portion 3107 illustrated in FIG. 12A includes a transistor 3140 and a capacitor 3141 and is electrically connected to a volatile memory portion 3106 through the transistor 3140. Although the transistor 3140 is an n-channel transistor in the following description in this embodiment, a p-channel transistor may be used as appropriate, in which case a potential supplied to a gate electrode may be reversed as appropriate.

Specifically, a source electrode (or a drain electrode) of the transistor 3140 is electrically connected to a node where a charge corresponding to data of the volatile memory portion 3106 is retained. The drain electrode (or the source electrode) of the transistor 3140 is electrically connected to one electrode of the capacitor 3141 (hereinafter, this node may be referred to as a node M1). A gate electrode of the transistor 3140 is supplied with a write control signal WE, and the transistor 3140 is turned on or off depending on the potential of the write control signal WE. The other electrode of the capacitor 3141 is supplied with a predetermined potential such as a ground potential (GND). With the capacitor 3141 provided as described above, more charge can be retained at the node M1, and data retention characteristics can be improved.

As the transistor 3140, a transistor having significantly low off-state current is preferably used. The transistor having significantly low off-state current preferably includes, in a channel formation region, a wide band-gap semiconductor which has a wider band gap and a lower intrinsic carrier density than a silicon semiconductor. For example, the wide band-gap semiconductor may have a band gap greater than 1.1 eV, preferably greater than or equal to 2.5 eV and less than or equal to 4 eV, more preferably greater than or equal to 3 eV and less than or equal to 3.8 eV. As examples of such a wide band-gap semiconductor, a compound semiconductor such as silicon carbide (SiC) or gallium nitride (GaN), an oxide semiconductor including a metal oxide such as an In—Ga–Zn—O-based oxide semiconductor, and the like can be given. Furthermore, a transistor manufactured using amorphous silicon, microcrystalline silicon, or the like can have a lower off-state current than a transistor manufactured using single crystal silicon; thus, amorphous silicon, microcrystalline silicon, or the like may be used for the transistor 3140.

Here, single crystal silicon has a band gap of approximately 1.1 eV, and has a concentration of thermally excited carriers of approximately $1\times10^{11}$ cm$^{-3}$ even when carriers caused by a donor or an acceptor do not exist at all (intrinsic semiconductor). In contrast, an In—Ga—Zn—O-based oxide semiconductor which is the wide band-gap semiconductor has a band gap of approximately 3.2 eV and has a concentration of thermally excited carriers of approximately $1\times10^{-7}$ cm$^{-3}$. The off-state resistance of the transistor (resistance between the source and the drain when the transistor is in an off-state) is inversely proportional to the concentration of thermally excited carriers in the channel formation region. Thus, the resistivity of the In—Ga—Zn—O-based oxide semiconductor in an off state is 18 orders of magnitude higher than that of silicon.

When such a wide band-gap semiconductor is used for the transistor 3140, the off-state current (per unit channel width (1 μm), here) at room temperature (25° C.) is less than or equal to 100 zA (1 zA (zeptoampere) is $1\times10^{-21}$ A), preferably less than or equal to 10 zA, for example.

The transistor of one embodiment of the present invention is used as the transistor 3140, in which case the off-state current density of the transistor can be less than 1 zA/μm, preferably less than 1 yA/μm at 85° C.

For example, when the off-state current (per unit channel width (1 μm), here) of the transistor 3140 at room temperature (25° C.) is less than or equal to 10 zA (1 zA (zeptoampere) is $1\times10^{-21}$ A), data can be retained for $10^4$ seconds or longer. It is needless to say that the retention time depends on transistor characteristics or the capacitance such as a capacitance at an electrode of the transistor.

In this embodiment, as the transistor having significantly low off-state current and used as the transistor 3140, the transistor including the oxide film in one embodiment of the present invention is preferably used.

At the time of storing data of the volatile memory portion 3106, the high potential H is supplied as the write control signal WE to turn on the transistor 3140, whereby a potential of the node where the charge corresponding to the data of the volatile memory portion 3106 is retained is applied to the node M1. Then, the low potential L is supplied as the write control signal WE to turn off the transistor 3140, whereby charge applied to the node M1 is retained. Since the off-state current of the transistor 3140 is significantly low, the charge at the node M1 is retained for a long time.

At the time of restoring the data to the volatile memory portion 3106, the high potential H is supplied as the write control signal WE to turn on the transistor 3140, whereby the potential of the node M1 is applied to the node where the charge corresponding to the data of the volatile memory portion 3106 is retained.

With the use of a wide band-gap semiconductor or the like for the transistor 3140, the off-state current of the transistor 3140 can be significantly low. Thus, when the transistor 3140 is turned off, the potential of the node M1 can be retained for a very long time. With such a configuration, the nonvolatile memory portion 3107 can be used as a nonvolatile memory element which is capable of retaining data without power supply.

Figure 12B:
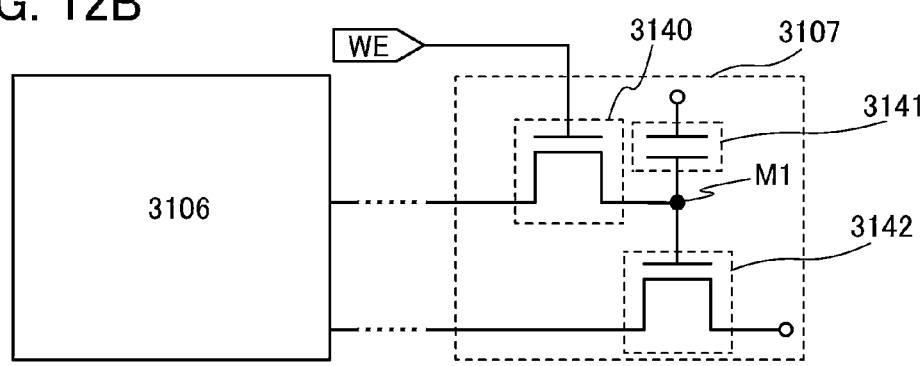

The nonvolatile memory portion 3107 may further include a transistor 3142 as illustrated in FIG. 12B, besides the components illustrated in FIG. 12A. A gate electrode of the transistor 3142 is electrically connected to the node M1; a drain electrode (or a source electrode) of the transistor 3142 is electrically connected to the node where the charge corresponding to the data of the volatile memory portion 3106 is retained; and the source electrode (or the drain electrode) of the transistor 3142 is supplied with a predetermined potential.

In the nonvolatile memory portion 3107 illustrated in FIG. 12B, the state of the transistor 3142 changes depending on the potential retained at the node M1 at the time of the data storing. That is, in the case where the high potential H is supplied at the time of the data storing, the transistor 3142 is turned on, and in the case where the low potential L is supplied, the transistor 3142 is turned off.

At the time of restoring the data, the potential of the drain electrode of the transistor 3142 is applied to the node where the charge corresponding to the data of the volatile memory portion 3106 is retained. That is, in the case where the high potential H is applied to the node M1 at the time of the data storing, the transistor 3142 is turned on, and the potential of the source electrode of the transistor 3142 is applied to the volatile memory portion 3106. In the case where the low potential L is applied to the node M1 at the time of the data storing, the transistor 3142 is turned off, and the potential of the source electrode of the transistor 3142 is not applied to the volatile memory portion 3106.

In terms of increasing the speed of data reading, a transistor similar to the transistor that is used for the volatile memory element is preferably used as the transistor 3142.

Note that the source electrode of the transistor 3142 and the other electrode of the capacitor 3141 may be at the same potential or at different potentials. The source electrode of the transistor 3142 may be electrically connected to the other electrode of the capacitor 3141. The capacitor 3141 is not necessarily provided; for example, in the case where the transistor 3142 has large parasitic capacitance, the parasitic capacitance may be substituted for the capacitor 3141.

Here, the drain electrode of the transistor 3140 and the gate electrode of the transistor 3142, i.e., the node M1, have an effect similar to that of a floating gate of a floating gate transistor which is used as a nonvolatile memory element. However, injection of an electric charge into a floating gate and extraction of an electric charge from the floating gate with the use of a high voltage are not needed because data can be directly rewritten by turning on and off the transistor 3140. That is, the nonvolatile memory portion 3107 does not require a high voltage which is needed for writing or erasing of a conventional floating gate transistor. Thus, with the use of the nonvolatile memory portion 3107 described in this embodiment, the consumption of power at the time of data storing can be reduced.

For a similar reason, a decrease in operation speed due to data writing operation or data erasing operation can be prevented; thus, the operation speed of the nonvolatile memory portion 3107 can be increased. Further, for a similar reason, there is no problem of deterioration of a gate insulating film (a tunnel insulating film), which arises in a conventional floating gate transistor. This means that unlike a conventional floating gate transistor, the nonvolatile memory portion 3107 described in this embodiment has no limit on the number of write cycles in principle. Therefore, the nonvolatile memory portion 3107 can be adequately used as a memory device which is required to be rewritable a large number of times and capable of high-speed operation, such as a register.

Figure 12C:
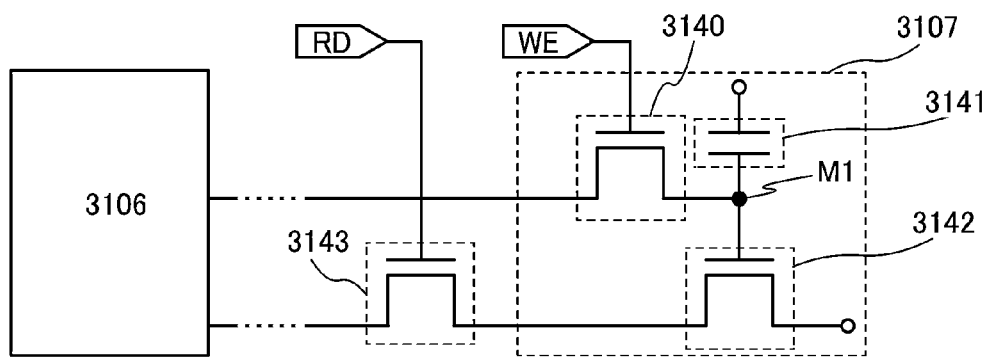

The nonvolatile memory portion 3107 may further include a transistor 3143 as illustrated in FIG. 12C, besides the components illustrated in FIG. 12B. A gate electrode of the transistor 3143 is supplied with a read control signal RD; a drain electrode (or a source electrode) of the transistor 3143 is electrically connected to the node where the charge corresponding to the data of the volatile memory portion 3106 is retained; and the source electrode (or the drain electrode) of the transistor 3143 is electrically connected to the drain electrode of the transistor 3142.

Here, the read control signal RD is a signal for supplying the high potential H to the gate electrode of the transistor 3143 at the time of the data restoring; at this time, the transistor 3143 can be turned on. Accordingly, at the time of the data restoring, a potential based on whether the transistor 3142 is in an on state or in an off state can be applied to the node where the charge corresponding to the data of the volatile memory portion 3106 is retained.

In terms of increasing the speed of data reading, a transistor similar to the transistor that is used for the volatile memory element is preferably used as the transistor 3143.

Figure 13:
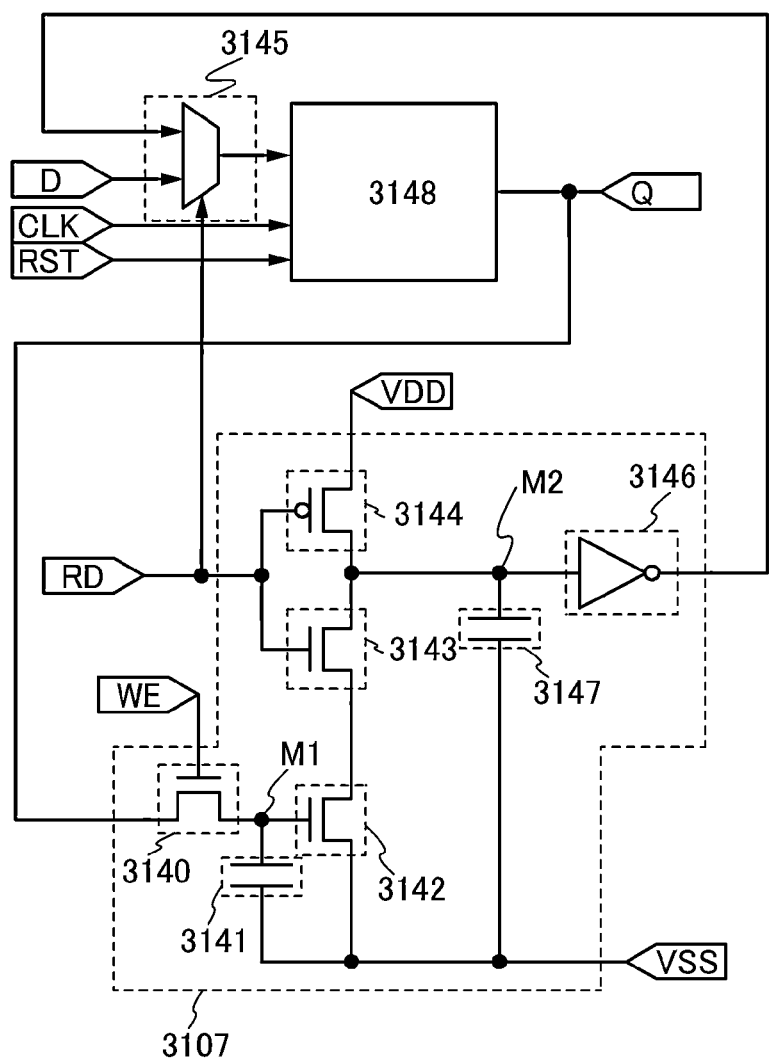
FIG. 13 illustrates a circuit configuration of a register.

FIG. 13 illustrates an example of a circuit configuration of a nonvolatile register which is capable of retaining one-bit data and includes the nonvolatile memory portion 3107 having the configuration illustrated in FIG. 12C. Note that the same reference numerals are used in FIG. 13 to denote components corresponding to those in FIG. 12C.

The circuit configuration of the register illustrated in FIG. 13 includes a flip-flop 3148, the nonvolatile memory portion 3107, and a selector 3145. Note that in the register illustrated in FIG. 13, the flip-flop 3148 is provided as the volatile memory portion 3106 illustrated in FIG. 12C.

The flip-flop 3148 is supplied with a reset signal RST, a clock signal CLK, and a data signal. The flip-flop 3148 has a function of retaining data of a data signal D input thereto in accordance with the clock signal CLK and outputting the data as a data signal Q.

The nonvolatile memory portion 3107 is supplied with the write control signal WE, the read control signal RD, and the data signal D.

The nonvolatile memory portion 3107 has a function of storing data of the data signal D input thereto in accordance with the write control signal WE and outputting the stored data as the data signal D in accordance with the read control signal RD.

The selector 3145 selects the data signal D or the data signal output from the nonvolatile memory portion 3107 in accordance with the read control signal RD and inputs the selected data signal to the flip-flop 3148.

As illustrated in FIG. 13, in the nonvolatile memory portion 3107, the transistor 3140 and the capacitor 3141 are provided.

The transistor 3140 is an n-channel transistor. One of source and drain electrodes of the transistor 3140 is electrically connected to an output terminal of the flip-flop 3148. The transistor 3140 has a function of controlling the retention of the data signal output from the flip-flop 3148 in accordance with the write control signal WE.

As the transistor 3140, a transistor including an oxide film and having low off-state current can be used as in the configuration illustrated in FIG. 12C.

One of a pair of electrodes of the capacitor 3141 is electrically connected to the other of the source and drain electrodes of the transistor 3140 (hereinafter, this node may be referred to as a node MD. The other of the pair of electrodes of the capacitor 3141 is supplied with the low potential L. The capacitor 3141 has a function of retaining a charge based on the data of the data signal D stored therein at the node M1. Since the transistor 3140 has significantly low off-state current, the charge at the node M1 is retained and the data is retained even when the supply of a power supply voltage is stopped.

A transistor 3144 is a p-channel transistor. One of source and drain electrodes of the transistor 3144 is supplied with the high potential H, and the read control signal is input to a gate electrode of the transistor 3144. The power supply voltage corresponds to a difference between the high potential H and the low potential L.

The transistor 3143 is an n-channel transistor. One of source and drain electrodes of the transistor 3143 is electrically connected to the other of the source and drain electrodes of the transistor 3144 (hereinafter, this node may be referred to as a node MD. The read control signal RD is input to a gate electrode of the transistor 3143.

The transistor 3142 is an n-channel transistor. One of source and drain electrodes of the transistor 3142 is electrically connected to the other of the source and drain electrodes of the transistor 3143, and the other of the source and drain electrodes of the transistor 3142 is supplied with the low potential L.

An input terminal of an inverter 3146 is electrically connected to one of the source and drain electrodes of the transistor 3144. An output terminal of the inverter 3146 is electrically connected to an input terminal of the selector 3145.

One of a pair of electrodes of a capacitor 3147 is electrically connected to the input terminal of the inverter 3146, and the other of the pair of electrodes of the capacitor 3147 is supplied with the low potential L. The capacitor 3147 has a function of retaining a charge based on data of a data signal input to the inverter 3146.

In the register illustrated in FIG. 13 having the above configuration, at the time of storing data of the flip-flop 3148, the high potential H is supplied as the write control signal WE to turn on the transistor 3140, whereby a charge based on the data of the data signal D of the flip-flop 3148 is applied to the node M1. Then, the low potential L is supplied as the write control signal WE to turn off the transistor 3140, whereby the charge applied to the node M1 is retained. In a period where the low potential L is supplied as the read control signal RD, the transistor 3143 is in an off state, the transistor 3144 is in an on state, and the potential of the node M2 is the high potential H.

At the time of restoring the data to the flip-flop 3148, the high potential H is supplied as the read control signal RD to turn off the transistor 3144 and turn on the transistor 3143, whereby the potential corresponding to the charge retained at the node M1 is applied to the node M2. In the case where a charge corresponding to the high potential H of the data signal D is retained at the node M1, the transistor 3142 is in an on state, the low potential L is supplied to the node M2, and the high potential H is returned to the flip-flop 3148 through the inverter 3146. In the case where a charge corresponding to the low potential L of the data signal D is retained at the node M1, the transistor 3142 is in an off state, the high potential H of the node M2 at the time when the low potential L is supplied as the read control signal RD is retained, and the low potential L is returned to the flip-flop 3148 through the inverter 3146.

By providing the volatile memory portion 3106 and the nonvolatile memory portion 3107 in the CPU 2003 as described above, data of the volatile memory portion 3106 can be stored in the nonvolatile memory portion 3107 before power supply to the CPU 2003 is stopped, and the data in the nonvolatile memory portion 3107 can be quickly restored to the volatile memory portion 3106 when power supply to the CPU 2003 is restarted.

By such data storing and restoring, it becomes unnecessary to restart the CPU 2003 with the volatile memory portion 3106 in an initialized state every time power supply is stopped. Thus, after power supply is restarted, the CPU 2003 can immediately start arithmetic processing on a measurement.

Note that the above nonvolatile memory portion 3107 is not limited to the configurations illustrated in FIGS. 12A to 12C and FIG. 13. For example, a phase change memory (PCM), a resistance random access memory (ReRAM), a magnetoresistive random access memory (MRAM), a ferroelectric random access memory (FeRAM), a flash memory, or the like can be used.

The plurality of volatile memory elements included in the volatile memory portion 3106 can be included in a register such as a buffer register or a general purpose register. The volatile memory portion 3106 can be provided with a cache memory including a static random access memory (SRAM) or the like. Data of such a register or a cache memory can be stored in the nonvolatile memory portion 3107.

Figure 14:
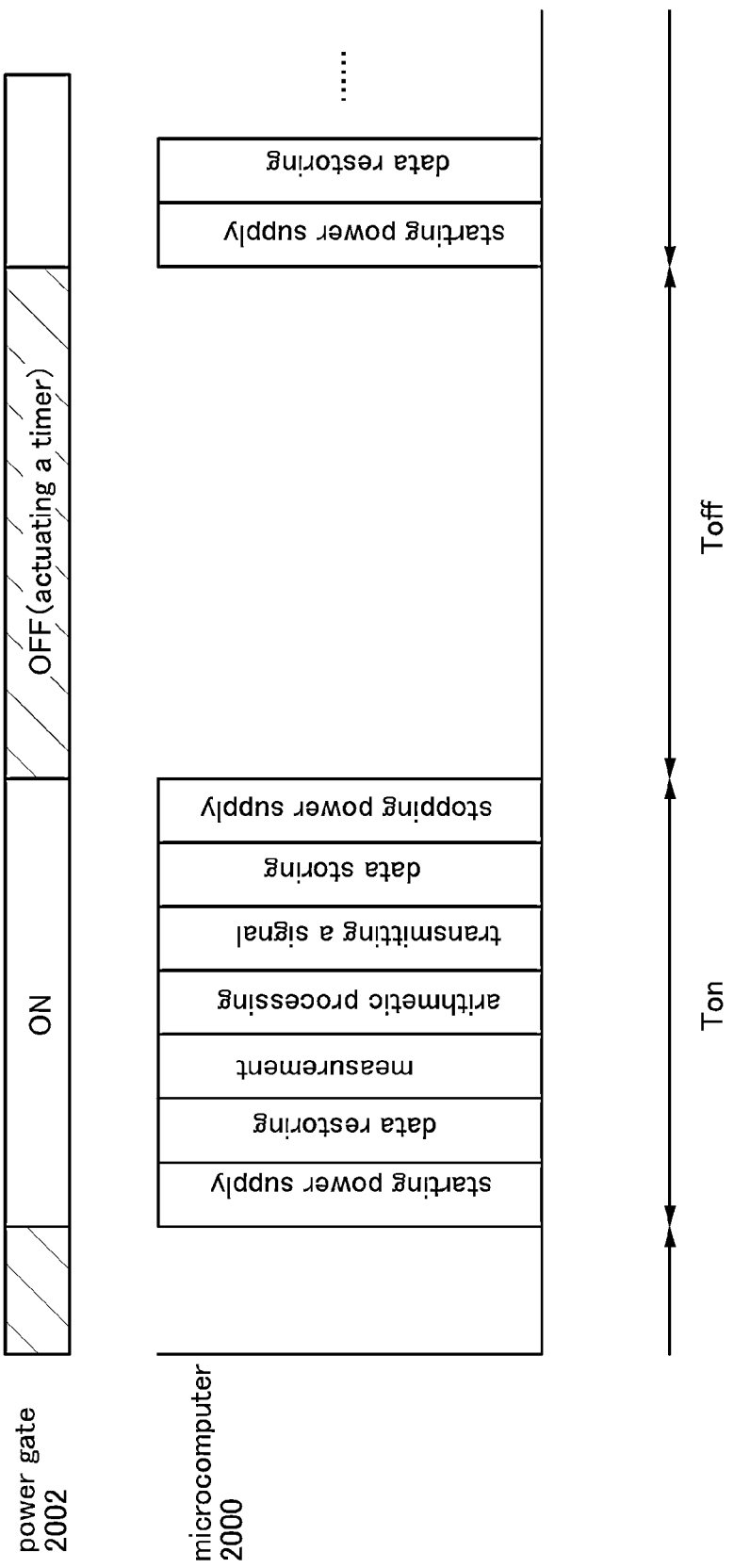
FIG. 14 illustrates operation of a micro computer.

Next, operation of the microcomputer 2000 in one embodiment of the present invention is described with reference to FIG. 14. FIG. 14 is a diagram illustrating the state of the power gate 2002 and the operation of the microcomputer 2000 in a power supply period Ton and a power supply stop period Toff.

The operation of the microcomputer 2000 is divided into an operation in the power supply period Ton and an operation in the power supply stop period Toff. In the power supply period Ton, the power gate 2002 is in an on state and power is supplied to the CPU 2003, the sensing portion 2004, and the interface 2007. In the power supply stop period Toff, the power gate 2002 is in an off state and power supply to the CPU 2003, the sensing portion 2004, and the interface 2007 is stopped.

The operation of the microcomputer 2000 in the power supply period Ton where the power gate 2002 is in an on state is described. First, by the control by the power gate controller 2001, the power gate 2002 is turned on to start power supply. At this time, power starts to be supplied to the CPU 2003, the sensing portion 2004, and the interface 2007 from the high-potential power supply line (VDD) through the power gate 2002. In the sensing portion 2004, power also starts to be supplied to the sensor 2010, the amplifier 2011, and the AD converter 2012.

Note that power does not necessarily need to be supplied to the CPU 2003, the sensing portion 2004, and the interface 2007 at the same time. For example, power can be supplied at different timings when the CPU 2003, the sensing portion 2004, and the interface 2007 are used.

Next, in the CPU 2003, data is restored from the nonvolatile memory portion 2006 to the volatile memory portion 2005. For details of the data restoring, the above description made with reference to FIGS. 12A to 12C and FIG. 13 can be referred to. By such data restoring in the CPU 2003, it becomes unnecessary to restart the CPU 2003 with the volatile memory portion 2005 in an initialized state every time the power supply period Ton starts. Thus, after power supply is restarted, the CPU 2003 can immediately start arithmetic processing.

Next, the sensing portion 2004 performs measurement of a physical quantity. In the sensor 2010, a potential based on a physical quantity input to the sensor 2010 is input to the amplifier 2011, and a potential amplified by the amplifier 2011 is input to the AD converter 2012. A potential converted from an analog signal into a digital signal by the AD converter 2012 is transmitted to the CPU 2003 as a measurement obtained by the sensing portion 2004.

Next, the CPU 2003 performs arithmetic processing on the measurement transmitted from the sensing portion 2004. For example, arithmetic processing for an output is performed on the measurement transmitted from the sensing portion 2004, and a signal based on the result of the processing is transmitted. The signal based on the result of the processing is transmitted to the bus line 2008 through the interface 2007.

The signal based on the result of the processing may be transmitted directly to another electronic device electrically connected to the CPU 2003, instead of the bus line 2008.

Next, in the CPU 2003, data of the volatile memory portion 2005 is stored in the nonvolatile memory portion 2006. For details of the data storing, the above description made with reference to FIGS. 12A to 12C and FIG. 13 can be referred to.

Next, by the control by the power gate controller 2001, the power gate 2002 is turned off to stop power supply. At this time, power stops being supplied to the CPU 2003, the sensing portion 2004, and the interface 2007 from the high-potential power supply line (VDD) through the power gate 2002. In the sensing portion 2004, power also stops being supplied to the sensor 2010, the amplifier 2011, and the AD converter 2012.

Note that power supply to the CPU 2003, the sensing portion 2004, and the interface 2007 does not necessarily need to be stopped at the same time. For example, power supply can be stopped at different timings when the CPU 2003, the sensing portion 2004, and the interface 2007 stop being used.

When the power supply period Ton ends in the above manner, the power supply stop period Toff starts. Here, when the power gate controller 2001 turns off the power gate 2002, the power gate controller 2001 actuates the timer therein to start time measurement. When the passage of a certain period of time is measured with the timer, the power gate controller 2001 turns on the power gate 2002 again and the power supply period Ton is restarted. Note that the length of time measured by the timer may be changed with software.

By such different operations of the alarm device in the power supply period Ton and the power supply stop period Toff with the power gate controller 2001 and the power gate 2002, power consumption can be reduced as compared with the case where power is constantly supplied. Since the power supply stop period Toff can be set much longer than the power supply period Ton, power consumption can be significantly reduced.

Furthermore, by providing the volatile memory portion 2005 and the nonvolatile memory portion 2006 in the CPU 2003, data of the volatile memory portion 2005 can be stored in the nonvolatile memory portion 2006 before power supply to the CPU 2003 is stopped, and the data in the nonvolatile memory portion 2006 can be quickly restored to the volatile memory portion 2005 when power supply to the CPU 2003 is restarted. Thus, after power supply is restarted, the CPU 2003 can immediately start arithmetic processing on a measurement.

With the volatile memory portion 2005 and the nonvolatile memory portion 2006 enabling such data storing and restoring, even when power consumption of the CPU 2003 is reduced by different operations in the power supply period Ton and the power supply stop period Toff, the alarm device can be operated without a drastic increase in time necessary to start the CPU 2003.

This embodiment can be implemented in appropriate combinations with any of the other embodiments.

Embodiment 5

In this embodiment, electric devices including the semiconductor device described in the above embodiment as a component are described.

Electric devices refer to industrial products including portions which operate with electric power. Electric devices include a wide range of applications for business use, industrial use, military use, and the like without being limited to consumer products such as household appliances.

Examples of electric devices include the following: display devices such as televisions and monitors, lighting devices, desktop or laptop personal computers, word processors, image reproduction devices which reproduce still images or moving images stored in recording media such as digital versatile discs (DVDs), portable or stationary audio reproduction devices such as compact disc (CD) players and digital audio players, portable or stationary radio receivers, audio recording and reproduction devices such as tape recorders and IC recorders (voice recorders), headphone stereos, stereos, remote controllers, clocks such as table clocks and wall clocks, cordless phone handsets, transceivers, cellular phones, car phones, portable or stationary game machines, pedometers, calculators, portable information terminals, electronic notebooks, e-book readers, electronic translators, audio input devices such as microphones, cameras such as still cameras and video cameras, toys, electric shavers, electric toothbrushes, high-frequency heating appliances such as microwave ovens, electric rice cookers, electric washing machines, electric vacuum cleaners, water heaters, electric fans, hair dryers, air-conditioning systems such as humidifiers, dehumidifiers, and air conditioners, dishwashing machines, dish drying machines, clothes dryers, futon dryers, electric refrigerators, electric freezers, electric refrigerator-freezers, freezers for preserving DNA, flashlights, electric power tools, alarm devices such as smoke detectors, gas alarms, and security alarms, health and medical equipment such as hearing aids, cardiac pacemakers, X-ray equipment, radiation counters, electric massagers, and dialyzers. Further examples include the following industrial equipment: guide lights, traffic lights, meters such as gas meters and water meters, belt conveyors, elevators, escalators, industrial robots, wireless relay stations, cellular base stations, power storage systems, and power storage devices for leveling the amount of power supply and smart grid. Moreover, examples of electric devices include moving objects such as electric vehicles (EV), hybrid electric vehicles (HEV) which include both an internal-combustion engine and a motor, plug-in hybrid electric vehicles (PHEV), tracked vehicles in which caterpillar tracks are substituted for wheels of the above vehicles, agricultural machines, motorized bicycles including motor-assisted bicycles, motorcycles, electric wheelchairs, electric carts, boats or ships, submarines, aircrafts such as fixed-wing aircrafts and rotary-wing aircrafts, rockets, artificial satellites, space probes, planetary probes, and spacecrafts.

Specific examples of these electric devices are illustrated in FIGS. 15A to 15D.

Figure 15A:
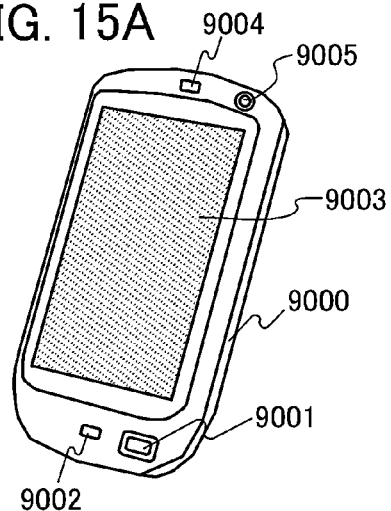
FIGS. 15A to 15F illustrate electric devices.

FIG. 15A illustrates a portable information terminal as one example. The portable information terminal illustrated in FIG. 15A includes a housing 9000, a button 9001, a microphone 9002, a display portion 9003, a speaker 9004, and a camera 9005, and has a function as a cellular phone. One embodiment of the present invention can be applied to an arithmetic unit, a wireless circuit, or a memory circuit inside a main body. Further, one embodiment of the present invention can be applied to the display portion 9003.

Figure 15B:
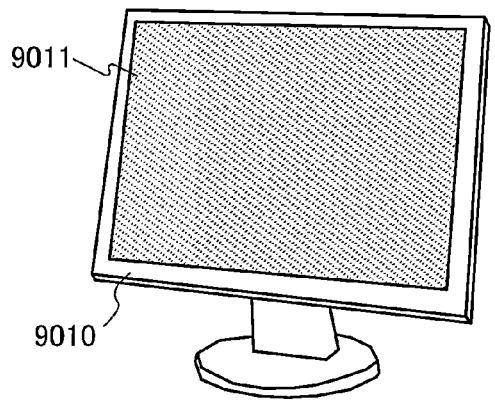

FIG. 15B illustrates a display. The display illustrated in FIG. 15B includes a housing 9010 and a display portion 9011. One embodiment of the present invention can be applied to an arithmetic unit, a wireless circuit, or a memory circuit inside a main body. Further, one embodiment of the present invention can be applied to the display portion 9011.

Figure 15C:
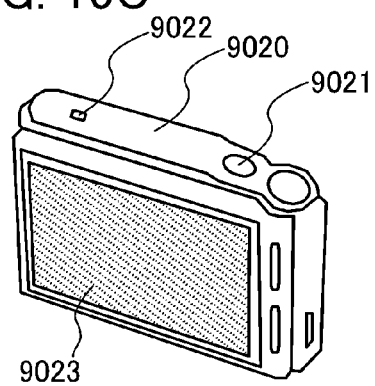

FIG. 15C illustrates a digital still camera. The digital still camera illustrated in FIG. 15C includes a housing 9020, a button 9021, a microphone 9022, and a display portion 9023. One embodiment of the present invention can be applied to an arithmetic unit, a wireless circuit, or a memory circuit inside a main body. Further, one embodiment of the present invention can be applied to the display portion 9023.

Figure 15D:
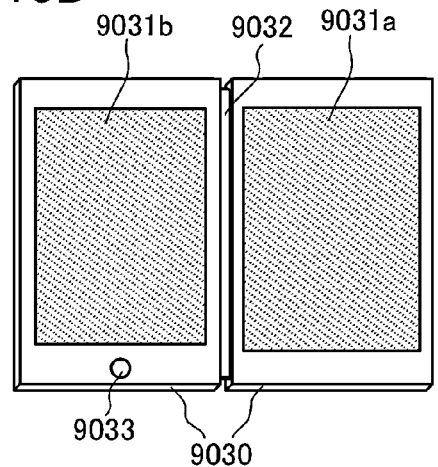

FIG. 15D illustrates a foldable portable information terminal. The foldable portable information terminal illustrated in FIG. 15D includes housings 9030, a display portion 9031a, a display portion 9031b, a hinge 9032, and an operation switch 9033. One embodiment of the present invention can be applied to an arithmetic unit, a wireless circuit, or a memory circuit inside a main body. Further, one embodiment of the present invention can be applied to the display portion 9031a and the display portion 9031b.

Part or the whole of the display portion 9031a and/or the display portion 9031b can function as a touch panel. By touching an operation key displayed on the touch panel, a user can input data, for example.

Figure 15E:
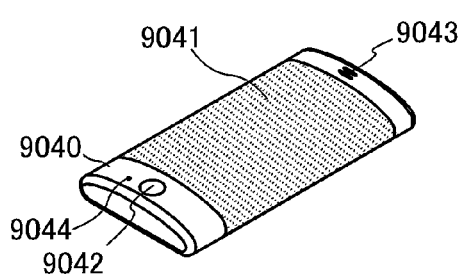
Figure 15F:
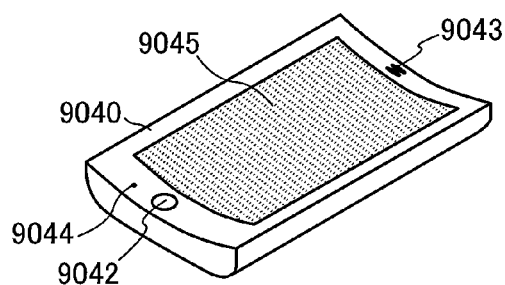

Electric devices illustrated in FIGS. 15E and 15F are examples of portable information terminals each including a display module with a curved surface in a display portion.

The portable information terminal illustrated in FIG. 15E includes an operation button 9042, a speaker 9043, a microphone 9044 in addition to a display portion 9041 provided in a housing 9040. The portable information terminal further includes an external connection port (not illustrated) such as a stereo headphone jack, a memory card slot, a camera connector, or a USB connector.

One embodiment of the present invention can be applied to an arithmetic unit, a wireless circuit, or a memory circuit inside a main body. Further, one embodiment of the present invention can be applied to the display portion 9041. By using a substrate with a curved surface as a support substrate for display elements, a portable information terminal including a panel with a curved surface can be obtained. The display portion 9041 is an example with an outwardly curved surface.

The portable information terminal illustrated in FIG. 15F is an example which has a configuration similar to that of the portable information terminal illustrated in FIG. 15E and includes a display portion 9045 curved along a side surface of the housing 9040. The portable information terminal illustrated in FIG. 15F is an example which has a configuration similar to that of the portable information terminal illustrated in FIG. 15E and includes the display portion 9045 which is curved inwardly.

Each of the display portions of the electric devices illustrated in FIGS. 15A to 15F and the like can also function as an image sensor. For example, an image of a palm print, a fingerprint, or the like is taken by touch on the display portion with the palm or the finger, whereby personal identification can be performed. Furthermore, when a backlight or a sensing light source which emits near-infrared light is provided for the display portion, an image of a finger vein, a palm vein, or the like can also be taken. Such a function can be achieved by using the semiconductor device in one embodiment of the present invention.

Each of the electric devices and the like can be operated with a button provided on the device or a touch panel provided in the display portion, or can be operated by recognition of user's movement (gesture) (also referred to as gesture input) using a camera provided on the device, a sensor provided in the device, or the like. Alternatively, each device can be operated by recognition of user's voice (also referred to as voice input). Such operation can be achieved by using the semiconductor device in one embodiment of the present invention.

The electric devices and the like can be connected to a network. The electric devices and the like not only can display information on the Internet but also can be used as a terminal which controls another device connected to the network from a distant place. Such a function can be achieved by using the semiconductor device in one embodiment of the present invention.

With the use of the semiconductor device in one embodiment of the present invention, an electric device with high performance and low power consumption can be provided.

This embodiment can be implemented in appropriate combinations with any of the other embodiments.

EXAMPLE 1

In this example, a transistor including an oxide semiconductor was manufactured, and the results obtained by examining the characteristics of the transistor are described.

First, a method for manufacturing the transistor employed in this example is described.

A silicon wafer was used as a substrate. First, a 100-nm-thick silicon oxide film and a 300-nm-thick silicon oxynitride film were formed as a base film 701 over the silicon wafer. The silicon oxide film was formed by performing thermal oxidation treatment at 950° C. in an oxidizing atmosphere containing chlorine. The silicon oxynitride film was formed by a CVD method.

Next, a surface of the silicon oxynitride film was planarized by CMP treatment.

After the planarization treatment, heat treatment was performed. The heat treatment was performed at 450° C. in a vacuum for one hour. Then, oxygen ions were implanted into the silicon oxynitride film by an ion implantation method. Note that the conditions of the oxygen ion implantation were as follows: an acceleration voltage of 60 kV and a dosage of $2.0 \times 10^{16}$ ions/cm$^2$.

Next, a 15-nm-thick IGZO film having an atomic ratio of In:Ga:Zn=1:1:1 was formed. The IGZO film was formed under the following conditions: a sputtering target having an atomic ratio of In:Ga:Zn=1:1:1 was used; argon with a flow rate of 30 sccm and oxygen with a flow rate of 15 sccm were supplied as sputtering gases into a treatment chamber of a sputtering apparatus; the pressure in the treatment chamber was controlled to be 0.4 Pa; and a DC power of 0.5 kW was supplied. Note that the substrate temperature for forming the IGZO film was 300° C.

After the formation of the IGZO film, heat treatment was performed. The heat treatment was performed at 450° C. in a nitrogen atmosphere for one hour, and then in an oxygen atmosphere for one hour.

The IGZO film was processed into an oxide semiconductor film 702 having an island shape by etching using a photolithography process.

Next, a 20-nm-thick tungsten film was formed over the oxide semiconductor film 702 having an island shape. The tungsten film was formed under the following conditions: a sputtering target of tungsten was used; argon with a flow rate of 80 sccm was supplied as a sputtering gas into the treatment chamber of the sputtering apparatus; the pressure in the treatment chamber was controlled to be 0.8 Pa; and a DC power of 1 kW was supplied. Note that the tungsten film was formed at 230° C. Then, the tungsten film was selectively etched to form a first conductive layer 703*a* and a second conductive layer 703*b*.

Next, a 10-nm-thick tungsten film was formed over the first conductive layer 703*a* and the second conductive layer 703*b*. The tungsten film was formed under the following conditions: a sputtering target of tungsten was used; argon with a flow rate of 80 sccm was supplied as a sputtering gas into the treatment chamber of the sputtering apparatus; the pressure in the treatment chamber was controlled to be 0.8 Pa; and a DC power of 1 kW was supplied. Note that the tungsten film was formed at 230° C. Then, the tungsten film was selectively etched to form a third conductive layer 704*a* and a fourth conductive layer 704*b*. Note that the third conductive layer 704*a* was formed to cover a side surface of the first conductive layer 703*a*, and the fourth conductive layer 704*b* was formed to cover a side surface of the second conductive layer 703*b*. Here, the first conductive layer 703*a* and the third conductive layer 704*a* serve as one of a source electrode and a drain electrode, and the second conductive layer 703*b* and the fourth conductive layer 704*b* serve as the other of the source electrode and the drain electrode.

Next, a 10-nm-thick silicon oxynitride film was formed as a gate insulating film 705 over the third conductive layer 704*a* and the fourth conductive layer 704*b* by a CVD method.

Next, a 10-nm-thick titanium nitride film and a 10-nm-thick tungsten film were formed over the silicon oxynitride film. The titanium nitride film was formed under the following conditions: a sputtering target of titanium was used; nitride with a flow rate of 50 sccm was supplied as a sputtering gas into the treatment chamber of the sputtering apparatus; the pressure in the treatment chamber was controlled to be 0.2 Pa; and a DC power of 12 kW was supplied. Note that the substrate temperature for forming the titanium nitride film was room temperature. The tungsten film was formed under the following conditions: a sputtering target of tungsten was used; argon with a flow rate of 100 sccm was supplied as a sputtering gas into the treatment chamber of the sputtering apparatus; the pressure in the treatment chamber was controlled to be 2.0 Pa; and a DC power of 1 kW was supplied. Note that the tungsten film was formed at 230° C. Then, the titanium nitride film and the tungsten film were selectively etched to form a fifth conductive layer 706 and a sixth conductive layer 707. Here, the fifth conductive layer 706 and the sixth conductive layer 707 serve as a gate electrode.

Next, a 20-nm-thick silicon oxynitride film, a 50-nm-thick silicon nitride film, and a 150-nm-thick silicon oxynitride film were formed as a first insulating layer 708, a second insulating layer 709, and a third insulating layer 710, respectively, by a CVD method. Here, the first insulating layer 708, the second insulating layer 709, and the third insulating layer 710 serve as interlayer insulating films.

Next, the interlayer insulating films were etched to form openings which reached the third conductive layer 704*a* and the fourth conductive layer 704*b*.

Next, a 50-nm-thick titanium film, a 200-nm-thick aluminum film, and a 50-nm-thick titanium film were formed over the interlayer insulating films by a sputtering method. The titanium films were formed under the following conditions: a sputtering target of titanium was used; argon with a flow rate of 20 sccm was supplied as a sputtering gas into the treatment chamber of the sputtering apparatus; the pressure in the treatment chamber was controlled to be 0.1 Pa; and a DC power of 12 kW was supplied. Note that the substrate temperature for forming the titanium films was room temperature. The aluminum film was formed under the following conditions: a sputtering target of aluminum was used; argon with a flow rate of 50 sccm was supplied as a sputtering gas into the treatment chamber of the sputtering apparatus; the pressure in the treatment chamber was controlled to be 0.4 Pa; and a DC power of 1 kW was supplied. Note that the substrate temperature for forming the aluminum film was room temperature.

Then, the titanium film, the aluminum film, and the titanium film were processed into a first wiring layer and a second wiring layer. Note that the first wiring layer is electrically connected to the third conductive layer 704a through the opening in the interlayer insulating films, and the second wiring layer is electrically connected to the fourth conductive layer 704b through the opening in the interlayer insulating films.

Through the above process, the transistor of this example was manufactured.

Figure 17:
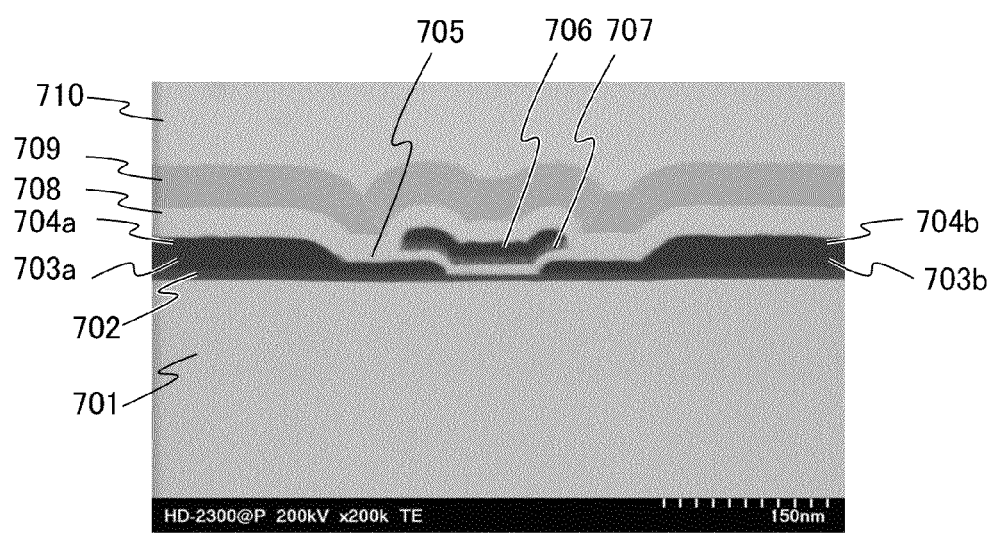
FIG. 17 is a cross-sectional STEM image of a transistor.

FIG. 17 is a cross-sectional STEM image of the transistor manufactured in this example. FIG. 17 is a cross-sectional view of the transistor in the channel length direction.

FIG. 17 shows that the coverage with the gate insulating film 705 and the gate electrode (the fifth conductive layer 706 and the sixth conductive layer 707) which are formed over the oxide semiconductor film 702, the third conductive layer 703a, and the fourth conductive layer 703b is improved, and a defect in shape such as disconnection does not occur.

Figure 18:
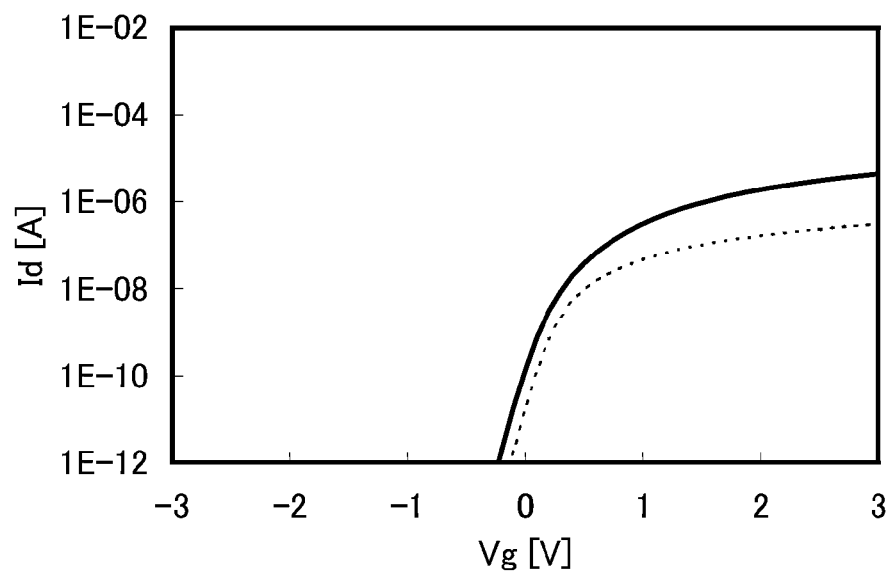
FIG. 18 is a graph showing electric characteristics of the transistor.

Next, in the transistor formed in this example, a drain current ($I_d$: [A]) was measured under the conditions that a drain voltage ($V_d$: [V]) was set to 0.1 V and 1 V and a gate voltage ($V_g$: [V]) was swept from −3 V to 3 V. FIG. 18 shows the measurement results of the transistor. In FIG. 18, the solid line indicates the measurement results when the drain voltage ($V_d$: [V]) was set to 1 V, the dotted line indicates the measurement results when the drain voltage ($V_d$: [V]) was set to 0.1 V, the horizontal axis indicates the gate voltage ($V_g$: [V]), and the vertical axis indicates the drain current ($I_d$: [A]). Note that "drain voltage ($V_d$: [V])" refers to a potential difference between a drain and a source when the potential of the source is used as a reference potential, and "gate voltage ($V_g$: [V])" refers to a potential difference between a gate and the source when the potential of the source is used as a reference potential.

FIG. 18 shows that in the transistor manufactured in this example, when the drain voltage ($V_d$: [V]) is 0.1 V, the on-state current is 0.26 μA, and when the drain voltage is 1 V, the on-state current is 3.6 μA. When the drain voltage is 0.1 V, the off-state current is less than or equal to the lower measurement limit ($1 \times 10^{-13}$ μA), and when the drain voltage is 1 V, the off-state current is less than or equal to the lower measurement limit ($1 \times 10^{-13}$ μA).

The above results indicate that the transistor of this example has excellent electric characteristics.

This application is based on Japanese Patent Application serial no. 2012-230361 filed with Japan Patent Office on Oct. 17, 2012, the entire contents of which are hereby incorporated by reference.

What is claimed is:

1. A semiconductor device comprising a transistor, the transistor comprising:
   a gate electrode;
   a stacked-layer oxide film comprising a first oxide semiconductor film, a second oxide semiconductor film, and a third oxide semiconductor film;
   a gate insulating film between the gate electrode and the stacked-layer oxide film; and
   a source electrode and a drain electrode which are in contact with the stacked-layer oxide film,
   wherein at least one of the first-third oxide semiconductor films includes a channel formation region,
   wherein a channel length of the transistor is greater than or equal to 5 nm and less than 60 nm,
   wherein a thickness of the gate insulating film is larger than a thickness of the one of the first-third oxide semiconductor films including the channel formation region,
   wherein each of the source electrode and the drain electrode comprises a first conductive layer and a second conductive layer over the first conductive layer,
   wherein the third oxide semiconductor film is between the source electrode of the first conductive layer and the second conductive layer over the first conductive layer, and is between the drain electrode of the first conductive layer and the second conductive layer,
   wherein a side surface of the second conductive layer extends beyond a side surface of the first conductive layer in a channel length direction, and
   wherein the side surface of the second conductive layer is over the channel formation region.

2. The semiconductor device according to claim 1, wherein the channel length of the transistor is greater than or equal to 10 nm and less than or equal to 40 nm.

3. The semiconductor device according to claim 1, wherein a thickness of the gate insulating film which is obtained by conversion into a thickness of a silicon oxide film is greater than or equal to 20 nm and less than or equal to 30 nm.

4. The semiconductor device according to claim 1, wherein an off-state leakage current of the transistor at 85° C. is less than 1 zA/μm.

5. The semiconductor device according to claim 1, wherein an off-state leakage current of the transistor at 85° C. is less than 1 yA/μm.

6. The semiconductor device according to claim 1,
   wherein the second oxide semiconductor film is over the first oxide semiconductor film, and the third oxide semiconductor film is over the first oxide semiconductor film with the second oxide semiconductor film provided therebetween, and
   wherein the second oxide semiconductor film includes the channel formation region.

7. The semiconductor device according to claim 1,
   wherein the second oxide semiconductor film is over the first oxide semiconductor film, and the third oxide semiconductor film is over the first oxide semiconductor film with the second oxide semiconductor film provided therebetween,
   wherein the second oxide semiconductor film is a c-axis aligned crystalline oxide semiconductor film including crystal parts, and
   wherein the third oxide semiconductor film is a c-axis aligned crystalline oxide semiconductor film or an amorphous oxide film.

8. The semiconductor device according to claim 1, further comprising:
   an oxide film over the first conductive layer and the second conductive layer, the oxide film being in contact with the stacked-layer oxide film; and
   a third conductive layer overlapping with the first conductive layer with the oxide film provided therebetween and a fourth conductive layer overlapping with the second conductive layer with the oxide film provided therebetween.

9. A semiconductor device comprising a transistor, the transistor comprising:
   a gate electrode over an insulating surface;
   a stacked-layer oxide film including oxide films;
   a gate insulating film between the gate electrode and the stacked-layer oxide film; and
   a source electrode and a drain electrode which are in contact with the stacked-layer oxide film, wherein at least one of the oxide films includes a channel formation region, wherein a channel length of the transistor is greater than or equal to 5 nm and less than 60 nm, wherein a thickness of the gate insulating film is larger than a thickness of the one of the oxide films including the channel formation region, wherein each of the source electrode and the drain electrode comprises a first conductive layer and a second conductive layer over the first conductive layer, and wherein a bottom surface of the second conductive layer is in contact with a top surface of the stacked-layer oxide film and the insulating surface.

10. The semiconductor device according to claim 9, wherein the stacked-layer oxide film includes a region where the gate electrode overlaps with the source electrode or the drain electrode in a channel length direction, and wherein a length of the region is greater than or equal to 5% and less than 10% of the channel length.

11. The semiconductor device according to claim 9, wherein a material of the first conductive layer is the same as a material of the second conductive layer.

12. The semiconductor device according to claim 9, wherein a material of the first conductive layer is different from a material of the second conductive layer.

13. The semiconductor device according to claim 9, wherein the channel length of the transistor is greater than or equal to 10 nm and less than or equal to 40 nm.

14. The semiconductor device according to claim 9, wherein a thickness of the gate insulating film which is obtained by conversion into a thickness of a silicon oxide film is greater than or equal to 20 nm and less than or equal to 30 nm.

15. The semiconductor device according to claim 9, wherein an off-state leakage current of the transistor at 85° C. is less than 1 zA/μm.

16. The semiconductor device according to claim 9, wherein an off-state leakage current of the transistor at 85° C. is less than 1 yA/μm.

17. The semiconductor device according to claim 9, wherein the stacked-layer oxide film is a stacked film of oxide semiconductor films.

18. The semiconductor device according to claim 9, wherein the oxide films include a first oxide film, a second oxide film over the first oxide film, and a third oxide film over the first oxide film with the second oxide film provided therebetween, and wherein the second oxide film includes the channel formation region.

19. The semiconductor device according to claim 9, wherein the oxide films include a first oxide film, a second oxide film over the first oxide film, and a third oxide film over the first oxide film with the second oxide film provided therebetween, wherein the second oxide film is a c-axis aligned crystalline oxide semiconductor film including crystal parts, and wherein the third oxide film is a c-axis aligned crystalline oxide semiconductor film or an amorphous oxide film.

\* \* \* \* \*